United States Patent
Kautzsch

(10) Patent No.: US 10,205,032 B2
(45) Date of Patent: Feb. 12, 2019

(54) SEMICONDUCTOR STRUCTURE AND METHOD FOR MAKING SAME

(75) Inventor: Thoralf Kautzsch, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 438 days.

(21) Appl. No.: 12/885,704

(22) Filed: Sep. 20, 2010

(65) Prior Publication Data

US 2012/0068304 A1   Mar. 22, 2012

(51) Int. Cl.
*H01L 21/74* (2006.01)
*H01L 29/66* (2006.01)
*H01L 29/94* (2006.01)

(52) U.S. Cl.
CPC ......... *H01L 29/945* (2013.01); *H01L 21/743* (2013.01); *H01L 29/66181* (2013.01); *H01L 29/66196* (2013.01)

(58) Field of Classification Search
CPC ............. H01L 29/945; H01L 29/66181; H01L 27/1082; H01L 27/10823; H01L 27/10829; H01L 29/66196; H01L 21/743
USPC ................................. 438/386–392; 257/532
See application file for complete search history.

(56) References Cited

U.S. PATENT DOCUMENTS

| 5,258,321 A * | 11/1993 | Shimizu ............ H01L 27/10861 257/E21.651 |
| 5,736,760 A * | 4/1998 | Hieda et al. ................... 257/301 |
| 5,998,821 A * | 12/1999 | Hieda et al. ................... 257/301 |
| 7,235,456 B2 | 6/2007 | Sato et al. |
| 2002/0137278 A1* | 9/2002 | Temmler et al. ............. 438/243 |
| 2004/0227174 A1* | 11/2004 | Richter ............. H01L 27/10832 257/300 |
| 2005/0269617 A1* | 12/2005 | Hofmann ................ H01L 21/84 257/309 |
| 2006/0076624 A1 | 4/2006 | Nagano et al. |
| 2007/0015327 A1* | 1/2007 | Su ....................... H01L 27/1087 438/244 |
| 2009/0194844 A1* | 8/2009 | Richter ................. H01L 21/743 257/532 |
| 2010/0283093 A1* | 11/2010 | Pei .......................... H01L 21/84 257/303 |

FOREIGN PATENT DOCUMENTS

DE    3785317 T2    10/1993
DE    3688231 T2    11/1993

* cited by examiner

*Primary Examiner* — Amar Movva
(74) *Attorney, Agent, or Firm* — Viering, Jentschura & Partner mbB

(57) ABSTRACT

One or more embodiments relate to a method of forming a semiconductor structure, comprising: providing a semiconductor substrate; forming an opening within the substrate; forming a conductive layer within the opening; and forming a semiconductor layer over the conductive layer.

30 Claims, 21 Drawing Sheets

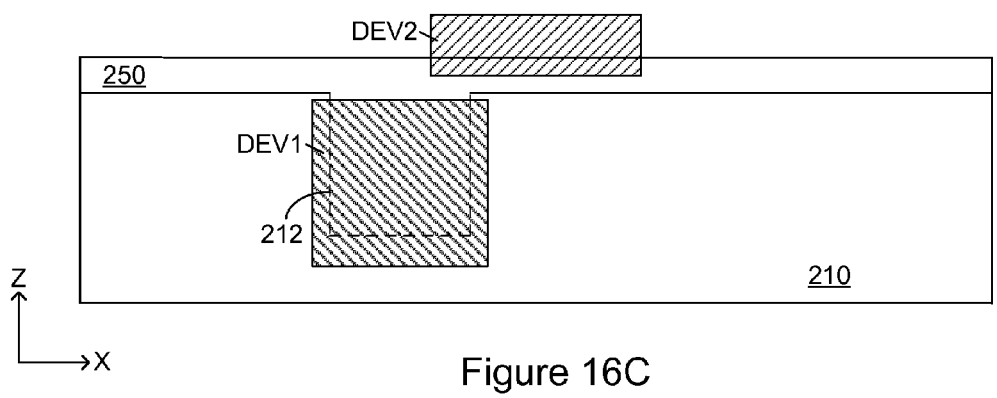
Figure 16C
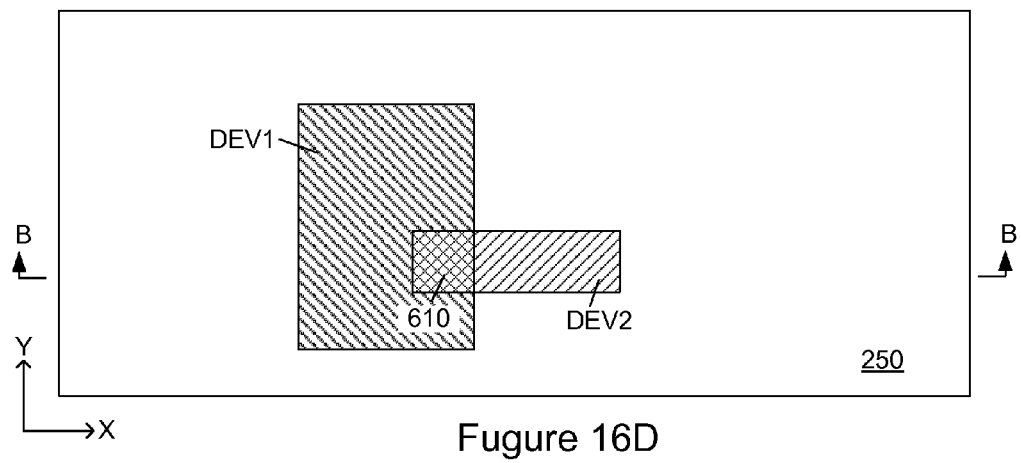
Fugure 16D

SEMICONDUCTOR STRUCTURE AND METHOD FOR MAKING SAME

TECHNICAL FIELD

One or more embodiments of the invention relate to semiconductor structures and methods for making semiconductor structures.

BACKGROUND

Integrated circuits may include capacitors as well as other devices. Capacitors, for example, may be realized in many ways such as MOS structures or a in the back end of line (BEOL) as part of the metallization layers. However, many capacitor designs require much space and an active area of the substrate or metallization area must be sacrificed. In circuits with large capacitor requirements, it may even be necessary to use external capacitors. New ways of making semiconductor structures are needed.

BRIEF DESCRIPTION OF THE DRAWINGS

FIG. 16C shows a cross sectional view of a semiconductor structure in accordance with an embodiment of a present invention;

FIG. 16D shows a top view of the structure shown in FIG. 16C;

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In one or more embodiments, when a structure A overlies (or is formed over) a structure B, in one or more embodiments, at least a portion of structure A may overlie at least a portion of the structure B. In one or more embodiments, a portion of structure A may overlie a portion of structure B. In one or more embodiments, a portion of structure A may overlie substantially all of structure B. In one or more embodiments, substantially all of structure A may overlie a portion of structure B. In one or more embodiments, substantially all of structure A may overlie substantially all of structure B.

In one or more embodiments, when a structure A overlies (or is formed over) a structure B, in one or more embodiments, at least a portion of structure A may cover at least a portion of the structure B.

In one or more embodiments, when a structure A overlies (or is formed over) a structure B, in one or more embodiments, at least a portion of structure A may be above (for example, directly above) at least a portion of the structure B.

In one or more embodiments, when a structure A overlies (or is formed over) a structure B, in one or more embodiments, at least a portion of structure A may cover and may be above (for example, directly above) at least a portion of the structure B.

In one or more embodiments, when a structure A overlies (or is formed over) a structure B, in one or more embodiments, structure A may be spaced apart from structure B so that structure A and structure B are not in direct contact. In one or more embodiments, when a structure A overlies (or is formed over) a structure B, in one or more embodiments, structure A and structure B may be in direct contact.

In one or more embodiments, a structure A may, for example, represent a layer, a region or a device. In one or more embodiments, a structure B may, for example, represent a layer, a region or a device.

Figure 1:
FIGS. 1 through 13 show methods of making semiconductor structure in accordance with embodiments of the present invention.

FIG. 1 shows a substrate 210. The substrate 210 may be any type of substrate. In one or more embodiments, the substrate 210 may be a semiconductor substrate. In one or more embodiments, the semiconductor substrate may be a bulk semiconductor substrate such as a bulk silicon substrate (e.g. a bulk monocrystalline silicon substrate). In one or more embodiments, the semiconductor substrate may be an SOI substrate which may include a bulk semiconductor substrate (e.g. a bulk silicon substrate), a dielectric layer overlying the bulk semiconductor substrate and a semiconductor layer (e.g. a silicon layer) overlying the dielectric layer. The SOI substrate may, for example, be formed by a SIMOX process. In one or more embodiments, the semiconductor substrate may be a silicon-on-sapphire (SOS) substrate or a germanium-on-insulator (GeOI) substrate.

In one or more embodiments, the semiconductor substrate may include one or more semiconductor materials such as silicon, silicon germanium, germanium, germanium arsenide, indium arsenide, indium gallium arsenide, or indium antimonide. In one or more embodiments, the substrate 210 may be without an epitaxial layer. In one or more embodiments, the substrate 210 may include an epitaxial layer. In some embodiments, the substrate 210 may be a wafer such as a semiconductor wafer. The semiconductor wafer may be a silicon wafer. In one or more embodiments, a wafer may be a bulk wafer. In one or more embodiments, a wafer may be an SOI wafer.

Figure 2A:
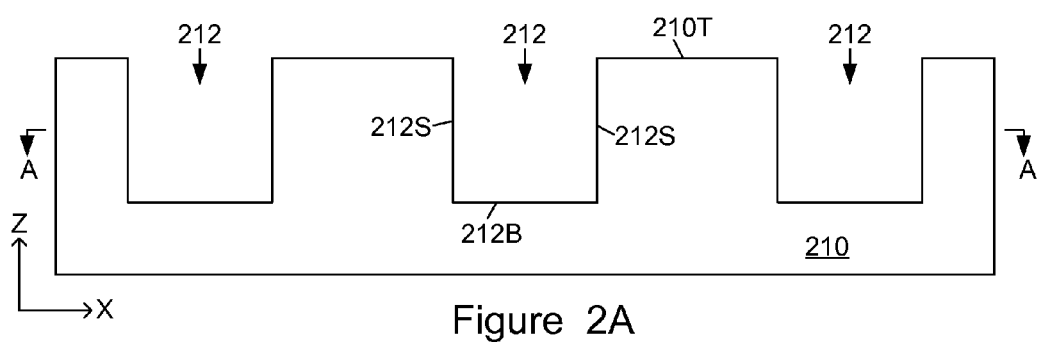

Referring to FIG. 2A, at least one opening 212 or a plurality of openings 212 may formed within the substrate 210. In the embodiment shown, the openings 212 go only partially through the substrate 210. In another embodiment, it is possible that the openings 212 are formed so that they go all the way through the substrate 210. In one or more embodiments, the openings 212 may be holes. The holes may have any cross-sectional shape. In one or more embodiments, the openings 212 may be formed as trenches. The openings 212 may be formed by an etching process such as a dry etching process. FIG. 2A shows a cross-sectional view in an XZ plane. The openings 212 shown have a bottom surface 212B and sidewall surfaces 212S. Openings may be formed have one or more sidewall surfaces.

Figure 2B:
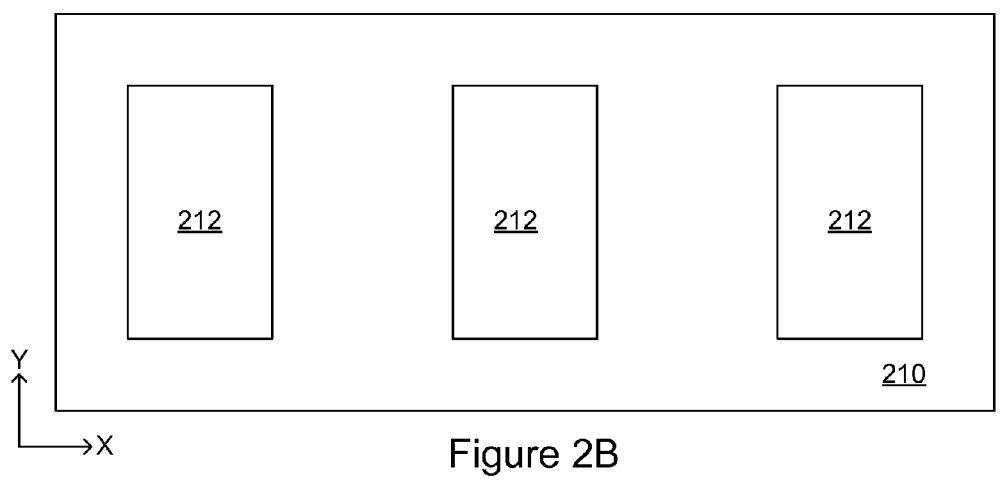

FIG. 2B shows a lateral cross-sectional view in an XY plane of the structure shown in FIG. 2A through the cross-section AA. In the embodiment shown, the openings 212 may be elongated such that, for example, the dimension of an opening 212 in a first lateral direction (such as the Y direction) is greater than the dimension of the opening 212 in a second lateral direction (such as the X direction) which may be substantially perpendicular to the first lateral direction. In the embodiment shown in FIG. 2B, the openings 212 may have substantially rectangular lateral cross-sections. However, in other embodiments, they may, for example, for formed having substantially oval lateral cross-sections or some other cross-sectional shape. In other embodiments, the openings 212 may have other lateral cross-sections such as substantially round or substantially square. In one or more embodiments, the openings 212 may have elongated lateral cross-sectional shapes.

Figure 2C:
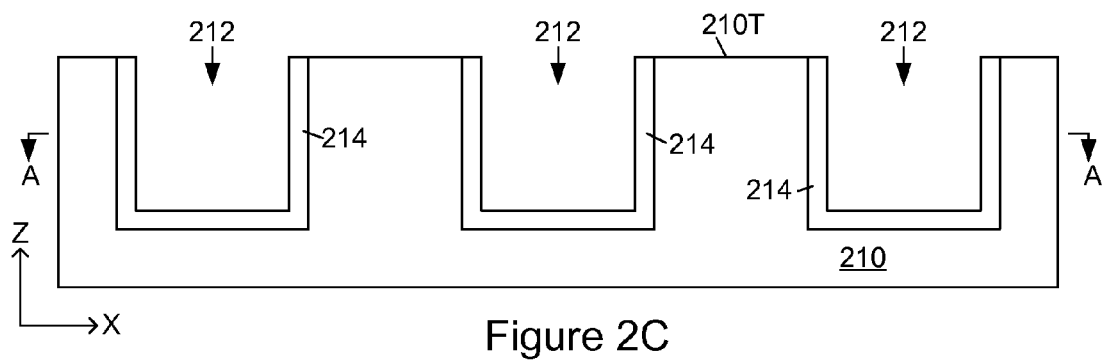
Figure 2D:
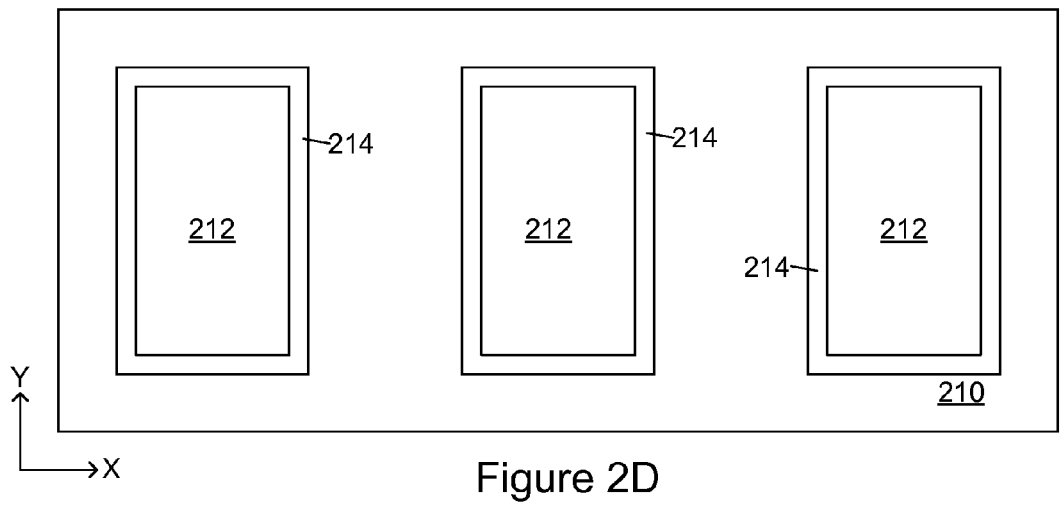
Figure 3:
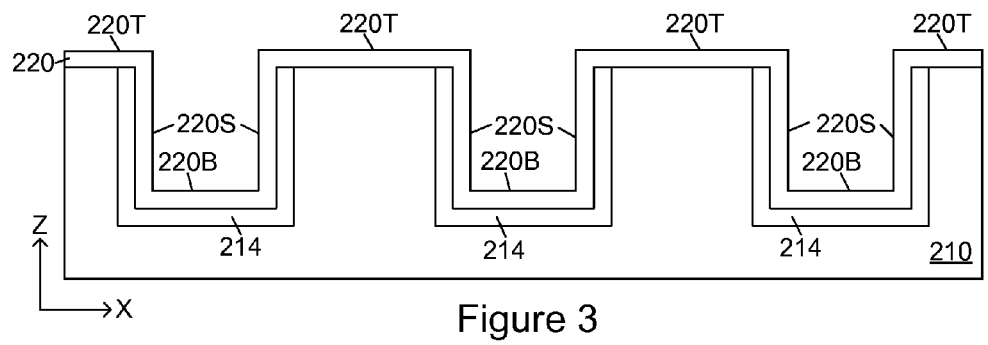

Referring to FIGS. 2C, 2D, as an optional step, after the formation of the openings 212, and preferably before the formation of the dielectric layer 220 as shown in FIG. 3, the substrate 210 may, optionally, be counter-doped so as to create counter-doped regions 214 in the substrate 210 about the bottom surface and sidewall surfaces of each of the openings 212. FIG. 2C shows a cross section in an XZ plane. FIG. 2D shows a lateral cross section in an XY plane through the cross section AA of FIG. 2C. As an example, if the substrate 210 is a p-type silicon substrate, the substrate may be counter-doped with an n-type dopant to create n-type regions 214 within the p-type substrate 210. As another example, if the substrate 210 is an n-type silicon substrate, the substrate may be counter-doped with a p-type dopant. As noted the counter-doping process is optional.

Referring to FIG. 3, in one or embodiments, a dielectric layer 220 may be formed over the top surface 210T of the substrate 210 as well as within the openings 212. The dielectric layer 220 may be formed over the sidewall and bottoms surfaces of openings 212. The dielectric layer 220 may be deposited by a substantially conformal deposition. The dielectric layer 220 may line the openings 212. In some embodiments, the dielectric layer 220 may comprise one or more dielectric materials such as an oxide (such as silicon oxide), a nitride (such as silicon nitride), an oxynitride (such as silicon oxynitride), or combinations thereof. The dielectric layer 220 may comprise a stack of two or more dielectric sub-layers. Two or more of the dielectric sub-layers may include a different dielectric material. For example, the dielectric layer 220 may comprises an ONO stack comprising a nitride sub-layer sandwiched between two oxide sub-layers. The dielectric layer 220 may include a bottom surface 220B, one or more sidewall surfaces 220S and a top surface 220T.

Figure 4:
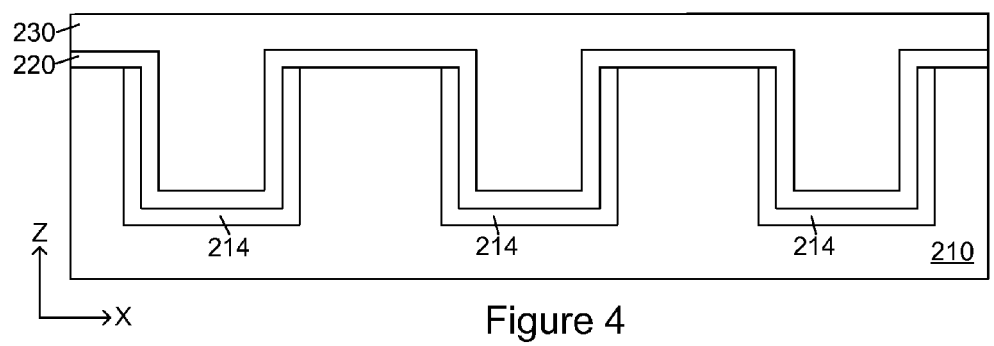

Referring to FIG. 4, a conductive layer 230 may be formed over the dielectric layer 220. As shown, the conductive layer 230 may be formed within the openings 212 as well as over the top surface 220T of dielectric layer 220. The conductive layer 230 may comprise one or more conductive materials. The conductive layer 230 may comprise polysilicon. The polysilicon may be doped polysilicon. The polysilicon may be p-doped or n-doped. The doping may be done in-situ or it may be introduced such as by ion implantation or diffusion. In one or more embodiments, the conductive layer 230 may comprise a metallic material such as a metal, a metallic alloy or a metallic compound. In one or more embodiments, a metallic alloy may include at least two metallic elements. In one or more embodiments, a metallic alloy may include a metallic element and a non-metallic element.

It is understood that conductive layer 230 may be deposited as a conductive layer or it may be made conductive in a later processing step. For example, the layer 230 may be deposited as a doped polysilicon which is doped in-situ. Likewise, the layer 230 may be deposited as undoped polysilicon which may then be doped using, a doping process such as ion implantation or diffusion or some other means.

Figure 5:
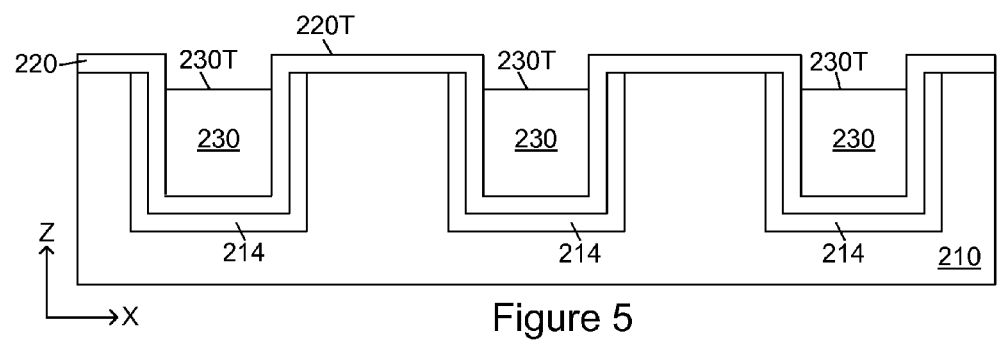

Referring to FIG. 5, a portion of the conductive layer 230 shown in FIG. 4 may be removed to form the structure shown in FIG. 5. In one or more embodiments, the removal may comprise an etching process. In one or more embodiments, the etching may comprise a dry etching process such as a plasma etching process. In one or more embodiments, the etching process may comprise a wet etching process. In one or more embodiments, the etching process may be an etch-back process. In one or more embodiments, the removal may include a chemical mechanical polishing process. In one or more embodiments, the removal process may remove the conductive layer 230 from the top surfaces 220T of the dielectric layer 220 but leave at least a portion of the conductive layer 230 within the openings 212. In one or more embodiments, the top surface 230T of each of the conductive layers 230 may be below that of the top surface 220T of the dielectric layer 220. In one or more embodiments, the top surface 230T of each of the conductive layers 230 may be substantially flush with the top surface 220T of the dielectric layer 220.

Figure 6:
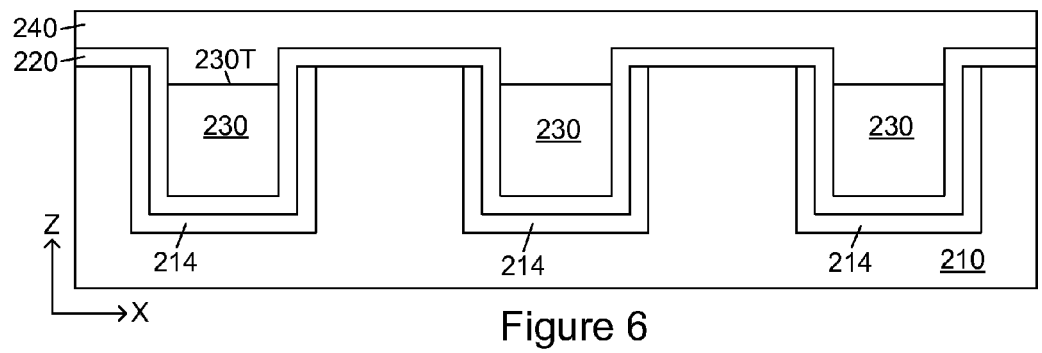

Referring to FIG. 6, a dielectric layer 240 may be formed over the structure shown in FIG. 5 to form the structure shown in FIG. 6. The dielectric layer 240 may be formed by a deposition process. The dielectric layer 240 may be deposited over the top surface 220T of dielectric layer 220 as well as over each of the conductive layers 230. A portion of the dielectric layer 240 may be formed within an upper portion of the openings 212. The dielectric layer 240 may comprise one or more dielectric materials selected from the group consisting of oxide, nitride and oxynitride. In one or more embodiments, the dielectric layer 240 may comprise the same dielectric material as dielectric layer 220. In one or more embodiments, the dielectric layer 240 may comprise a dielectric material different from that of dielectric layer 220.

Figure 7:
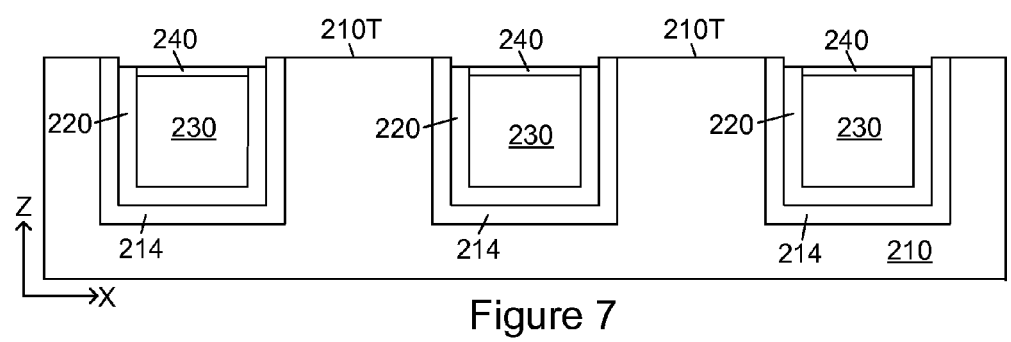

Referring to FIG. 7, a portion of the dielectric layer 240 (shown in FIG. 6) as well as a portion of the dielectric layer 220 (also shown in FIG. 6) may be removed to form the structure shown in FIG. 7. The removal process may include one or more etching processes. The etching processes may include one or more wet etching process. In one or more embodiments, the dielectric layer 240 may comprise an oxide while the dielectric layer 220 may comprise both an oxide and a nitride. Two or more etching processes may be needed (e.g. different chemicals may be needed) to etch the different materials. In one or more embodiments, the removal process may include a chemical mechanical polishing process.

Referring to FIG. 7, in one or more embodiments, as a result of the removal process, the top surface 210T of the substrate 210 may be exposed. Also, as a result of removing a portion of dielectric layer 240 shown in FIG. 6, one or more individual dielectric layers 240 may remain which overlie each of the conductive layers 230. In one or more embodiments, a dielectric layer 240 may overlie substantially all of a corresponding conductive layer 230. Still referring to FIG. 7, the top surface of a remaining dielectric layer 240 may be below or substantially flush with the top surface 210T of the substrate 210. Each of the conductive layers 230 may thus be substantially enclosed by one or more dielectric materials. In the embodiment of FIG. 7, each conductive layer 230 may be bordered on the sides and bottom by the dielectric layer 220. Also, each conductive layer 230 is bordered on the top by a dielectric layer 240.

Figure 8:
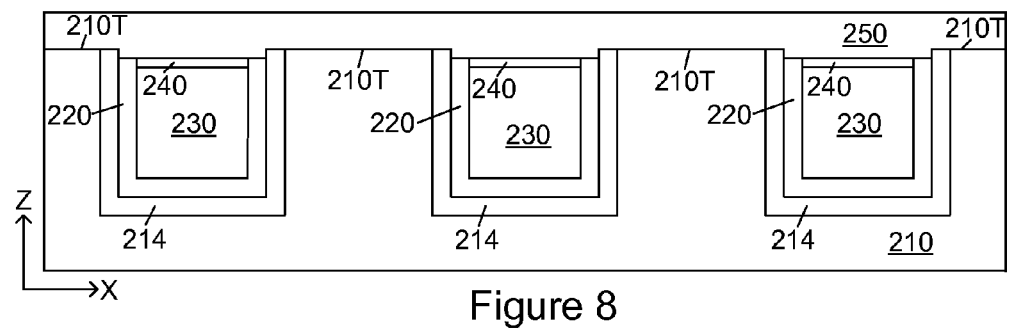

Referring to FIG. 8, a layer 250 may be formed over the structure shown in FIG. 7 to form the structure shown in FIG. 8. In one or more embodiments, the layer 250 may be a semiconductor layer. The layer 250 may include one or more semiconductor materials. In one or more embodiments, the layer 250 may be a silicon layer. The layer 250 may comprise silicon. The layer 250 may comprise monocrystalline silicon (e.g. bulk monocrystalline silicon). The layer 250 may be a monocrystalline silicon layer. The layer 250 may be formed by a deposition and/or growth process. In one or more embodiments, the layer 250 may be formed by an epitaxial growth process. In one or more embodiments, the layer 250 (e.g. an epitaxial layer) may be formed by the epitaxial growth of a layer monocrystalline silicon upon the surface of a monocrystalline silicon substrate. In one or more embodiments, the epitaxial growth of the monocrystalline silicon (or possibly some other semiconductor material) may be caused by a deposition process such as a chemical vapor deposition process. In one or more embodiments, a method used for silicon epitaxial growth may be vapor phase epitaxy.

Referring to FIG. 8, in one or more embodiments, the substrate 210 may be a bulk monocrystalline silicon substrate or it may be a silicon-on-insulator substrate having a monocrystalline silicon overlayer. In either case, the top surface 210T of the substrate 210 may comprise monocrystalline silicon. The top surface 210T of substrate 210 (and possibly other exposed surfaces of the substrate 210) may thus serve as a seed crystal or a nucleation site for the growth of an epitaxial monocrystalline silicon material. The epitaxial monocrystalline silicon may grow on the exposed top surface 210T of the substrate 210. In one or more embodiments, the semiconductor layer 250 may be in direct physical contact with the substrate 210.

In one or more embodiments, the silicon (e.g. monocrystalline silicon) may not grow on the exposed top surfaces of the dielectric layers 240 and may not grow on the exposed surfaces of the dielectric layers 220. In one or more embodiments, the silicon may only grow on the exposed monocrystalline silicon surfaces of substrate 210 (such as top surface 210T, which may include exposed portions of counter-doped regions 214). Hence, the epitaxial growth process may be a selective epitaxial growth process. However, the silicon (e.g. monocrystalline silicon) may grow on the top surface 210T (and possibly on other exposed surfaces of the substrate) in a direction so as to spill over and overlie (or may be in direct contact with) each of the remaining dielectric layers 240. The silicon (e.g. monocrystalline silicon may also spill over and overlie (or be in direct contact with) the exposed surfaces of dielectric layers 220 (shown in FIG. 7 as being flush with surface 210T. In one or more embodiments, the silicon from the spill over and overlie (or be in direct contact with) at least a portion of each of the remaining dielectric layers 240 and at least a portion of the exposed portions of dielectric layer 220. In one or more embodiments, the silicon from the spill over and overlie (or be in direct contact with) substantially all of remaining dielectric layers 240 and substantially all of the exposed portions of dielectric layer 220.

The semiconductor layer 250 (e.g. a monocrystalline silicon layer) may thus be formed over (e.g. from the spill over) each of the conductive layers 230. The semiconductor layer 250 may overlie each of conductive layers 230. In one or more embodiments, the semiconductor layer 250 may overlie at least a portion of each of the conductive layers 230. In one or more embodiments, the semiconductor layer 250 may overlie substantially all of each of the conductive layers 250.

It is additionally noted that, in one or more embodiments, the monocrystalline silicon (or possibly other semiconductor material) from the spill-over may at least partially close the openings 212 (as shown in FIG. 2). In one or more embodiments, the monocrystalline silicon from the spill-over may substantially close each of the openings 212.

In one or more embodiments, the epitaxial growth process may be a selective epitaxial growth process. As noted, the monocrystalline silicon may grow on the substrate but may not grow on the dielectric layers.

In one or more embodiments, the semiconductor layer 250 may be doped in-situ during the formation process (e.g. epitaxial growth process). The dopant may be p-type or n-type. In one or more embodiments, the semiconductor layer 250 may be doped after the formation (e.g. epitaxial growth) of the layer 250. The dopant may be p-type dopant or n-type dopant. The dopant used may correspond to the dopant type of the substrate 210. In some embodiments, if the substrate 210 is p-type, then the layer 250 may also be doped p-type. In some embodiments, if the substrate 210 is n-type, then the layer 250 may also be doped n-type. As described, in one or more embodiments, the layer 250 may be doped using an in-situ process or the dopant may be introduced in some other way such as ion implantation or a diffusion process.

Figure 9A:
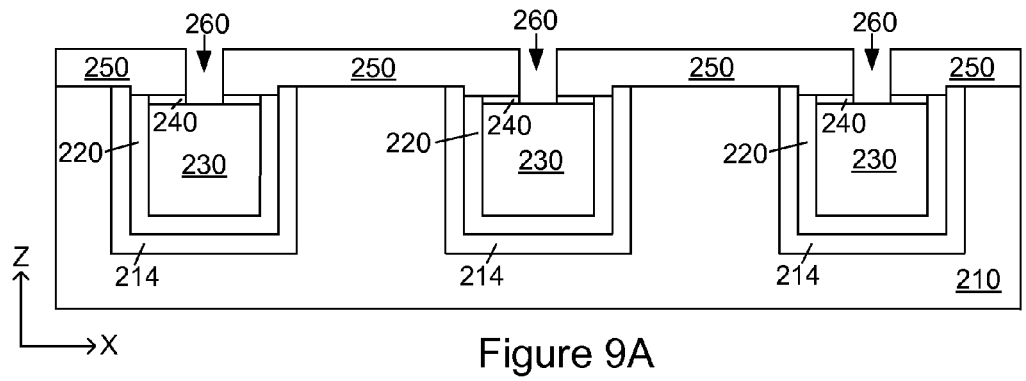
Figure 9B:
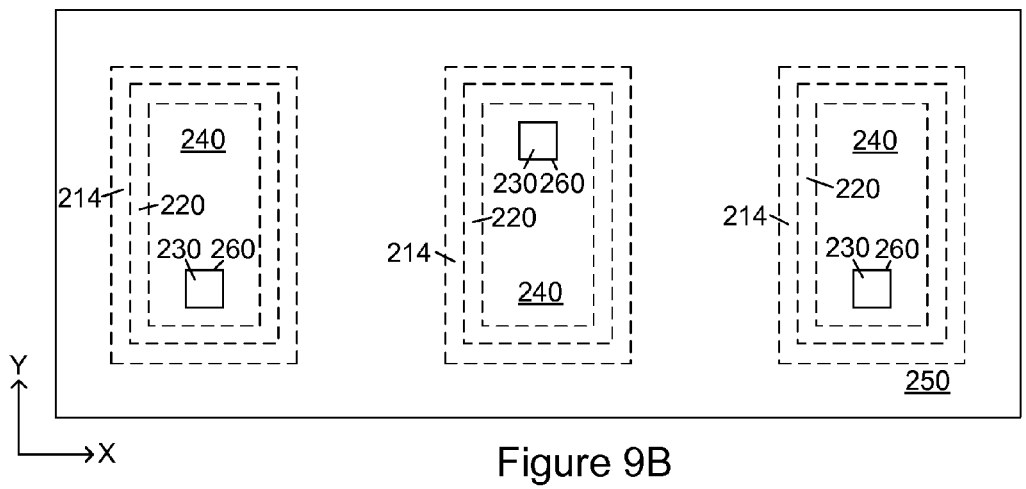

Referring to FIG. 9A and FIG. 9B, one or more openings 260 may be formed through the layer 250 (which may, for example, be a silicon layer 250 such as a monocrystalline silicon layer) as well as through the dielectric layers 240 to form the structures shown in FIG. 9A. In one or more embodiments, an opening 260 may be formed over each conductive layer 230. The openings 260 may be formed so as to expose the conductive layers 230. The openings 260 may be formed as holes or trenches. The openings 260 (e.g. holes or trenches) may have any lateral cross-sectional shape. Each of the openings 260 may have one or more sidewall surfaces. FIG. 9A shows a cross section in the XZ plane.

FIG. 9B shows an embodiment of a top view (from the top down) of the structure shown in FIG. 9A. As shown in FIG. 9B, in one or more embodiments, the openings 260 may be formed in a staggered configuration. In the embodiment shown the openings 260 may be staggered so that not all of them align in the x-direction. For example, the openings 260 may be staggered to that they are not all in the same row (e.g. a row along the x-direction). Adjacent openings 260 may, for example, be staggered in the y-direction. In one or more embodiments, adjacent openings 260 in the x-direction may be made placed in alternating positions in the y-direction. In one or more embodiments, the openings 260 may be aligned in the same rows. More generally, the openings 260 may be placed anywhere. In some embodiments, the positioning of the openings 260 may depend upon the placement of devices within layer 250 and/or over layer 250. Hence, in some embodiments, the openings 260 may be positioned so as to make room for devices which may be formed within and/or over the layer 250.

Figure 10:
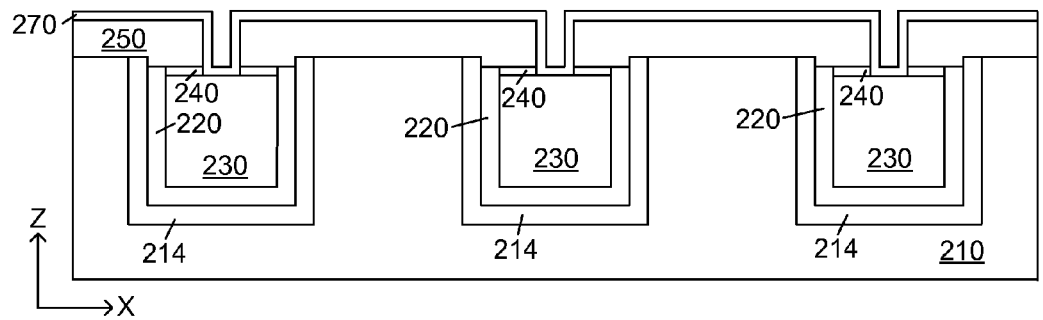

Referring to FIG. 10, a dielectric layer 270 may be formed over the structure shown in FIGS. 9A,B to form the structure shown in FIG. 10. The dielectric layer 270 may be formed by a deposition process such as a substantially conformal deposition process. The dielectric layer 270 may line the one or more sidewall surfaces and the bottom surface of each of the openings 260. The dielectric layer 270 may comprise one or more dielectric materials from the group consisting of oxide, nitride, and oxynitride.

Figure 11:
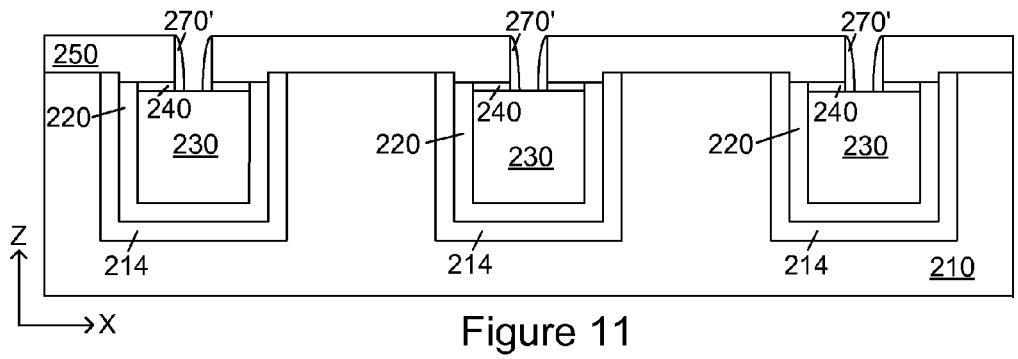

Referring to FIG. 11, after the deposition of the dielectric layer 270, the dielectric layer 270 may be subjected to a substantially anisotropic etch (for example, a spacer etch), to form dielectric sidewall spacers 270' on the one or more sidewall surfaces of each of the openings 260. The substantially anisotropic etch may expose the conductive layers 230.

Figure 12:
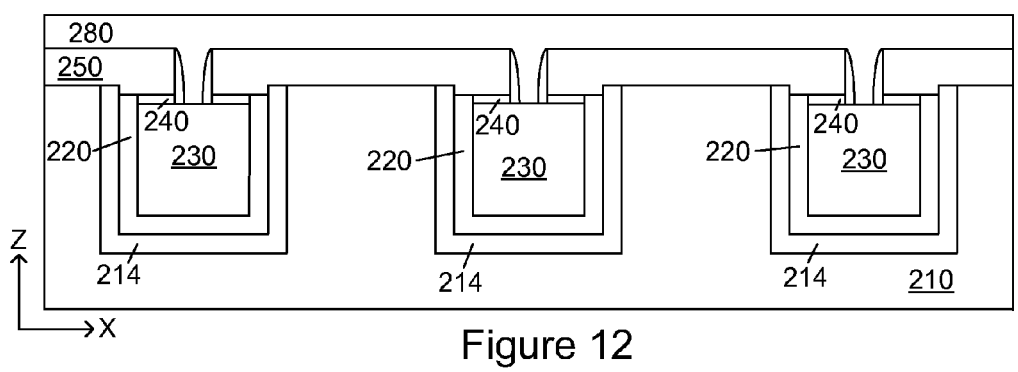

Referring to FIG. 12, after the formation of the dielectric sidewall spacers 270', a conductive layer 280 may be formed over structure shown in FIG. 11 to form the structure shown in FIG. 12. The conductive layer 280 may be formed within each of the openings 260 and may be formed over the top surface of layer 250. The conductive layer 280 may comprise one or more conductive materials. In one or more embodiments, the conductive material may be a metallic material. In one or more embodiments, the conductive material may be a non-metallic material such as a doped polysilicon. The doped polysilicon can be doped in-situ or it may also be possible that the doped polysilicon is doped, for example, through ion-plantation or other means. The conductive layer 280 may be deposited as a conductive material or may be made conductive at a later processing step.

Figure 13:
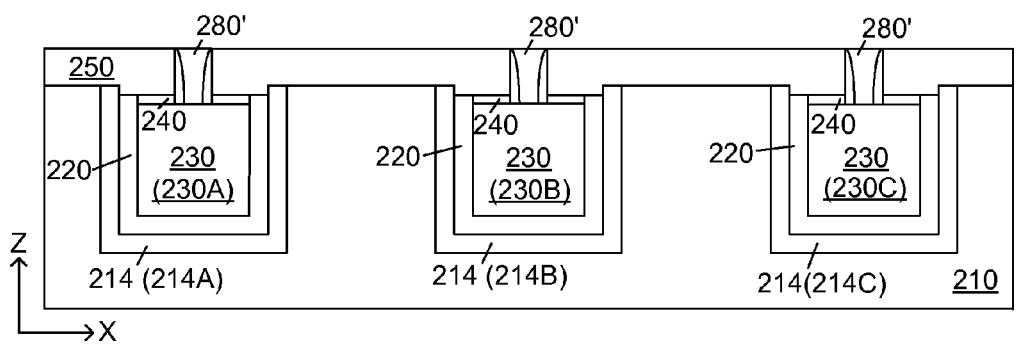

Referring to FIG. 13, the conductive layer 280 may be etched and/or chemically mechanically polished to remove the conductive layer 280 from the top surface of layer 250. The remaining portions 280' of layer 280 form conductive contacts 280' within each of the openings 270. In one or more embodiments, the conductive contacts 280' may be conductive plugs. Each of the conductive contacts 280' may be electrically coupled to a respective conductive layer 230. In one or more embodiments, each conductive contact 280' may be in direct contact with a respective conductive layer 230.

Referring to FIG. 13, conductive layers 230 are shown as conductive layers 230A,B,C. Each of the conductive layers 230A,B,C may be viewed as a first capacitor plate. In one or more embodiments, the conductive layers 230A,B,C may be substantially parallel to each other. The counter-doped regions 214 are shown as counter-doped regions 214A,B,C. Each of the counter-doped regions 214A,B,C may be viewed as a second capacitor plate opposite a corresponding first capacitor plate 240A,B,C.

Figure 14A:
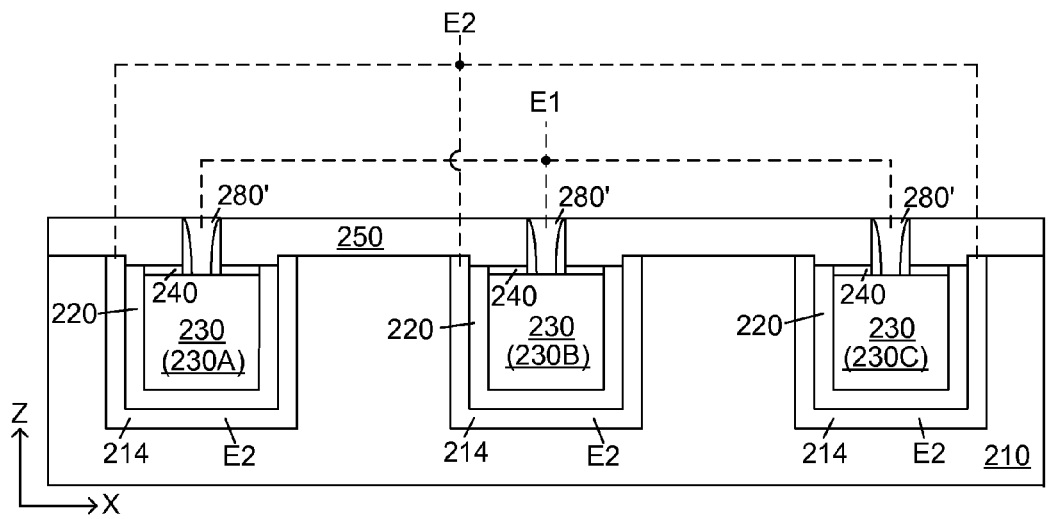
FIG. 14A shows a semiconductor structure in accordance with an embodiment of the present invention.

Referring to FIG. 14A, the conductive layers 230A,B,C (e.g. first capacitor plates 230A,B,C) may all be electrically coupled together to form a first capacitor electrode E1. Likewise, the counter-doped regions 214A,B,C (e.g. second capacitor plates 214A,B,C) may all be electrically coupled together to form a second capacitor electrode E2. The dielectric layer 220 may serve as the capacitor dielectric. Hence, a capacitor may be formed within the substrate 210.

The first capacitor plates 230A,B,C may be electrically coupled together using, for example, one or more of the metallization levels formed over the semiconductor layer 250. As explained below, it may also be possible that the conductive plates 230A,B,C be electrically coupled together using one or more conductive channels formed within the substrate 210.

It is noted that in the embodiments shown in FIG. 14A, all of the first plates 230A,B,C are coupled together to form a first electrode E1 and all of the second plates 214A,B,C are coupled together to form a second electrode E2 so as to form a single capacitor. However, in other embodiments, a capacitor may instead be formed where each capacitor electrode includes only one first capacitor plate (for example, 230A) and only one second capacitor plate (for example, 214A). Likewise, a capacitor may be formed that includes at least two electrically coupled first capacitor plates (for example, 230A and 230B) and at least two electrically coupled second capacitor plates (for example, 214A and 214B). Hence, one, two or more independent capacitors may be formed within the substrate. These capacitors may later, of course, be electrically coupled together (e.g. in series and/or in parallel).

Figure 14B:
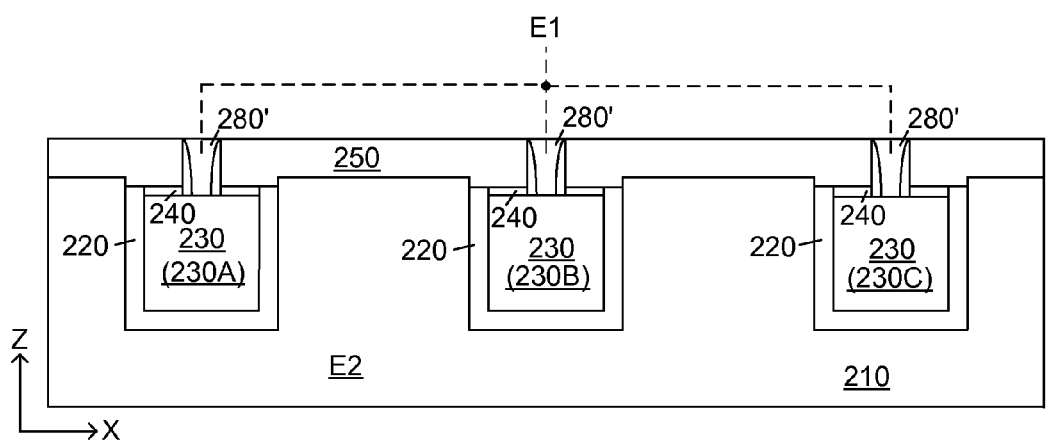
FIG. 14B shows a semiconductor structure in accordance with an embodiment of the present invention.

As noted above, the counter-doped regions 214 are optional. FIG. 14B shows an embodiment without such regions. In the embodiment shown in FIG. 14B, it is possible that the conductive layers 230A,B,C may serve as an electrode E1 while the substrate 210 may serve as the second capacitor electrode E2 and the dielectric layers 220 may serve as the capacitor dielectric. In one or more embodiments, it may be possible that a counter-doped well formed within the substrate 210 may serve as a second electrode E2.

Figure 15A:
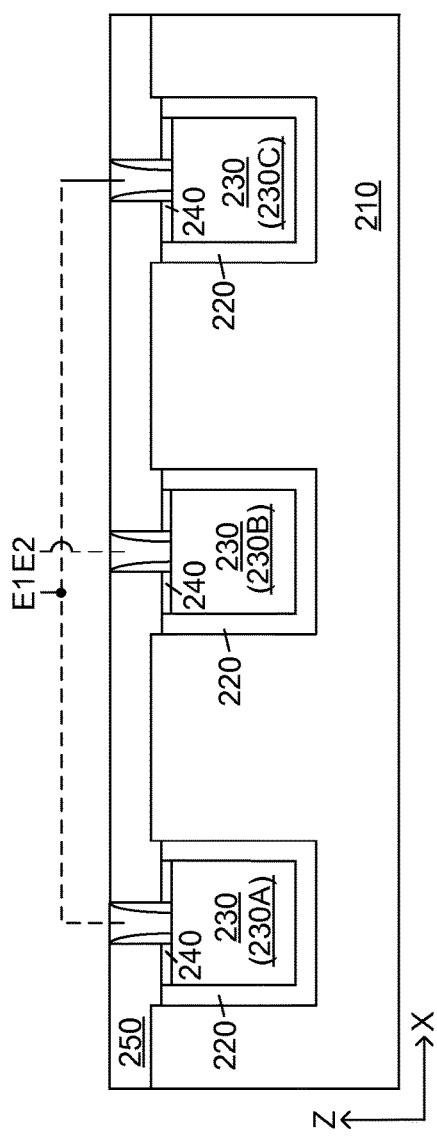
FIG. 15A shows a semiconductor structure in accordance with an embodiment of the present invention.
Figure 15B:
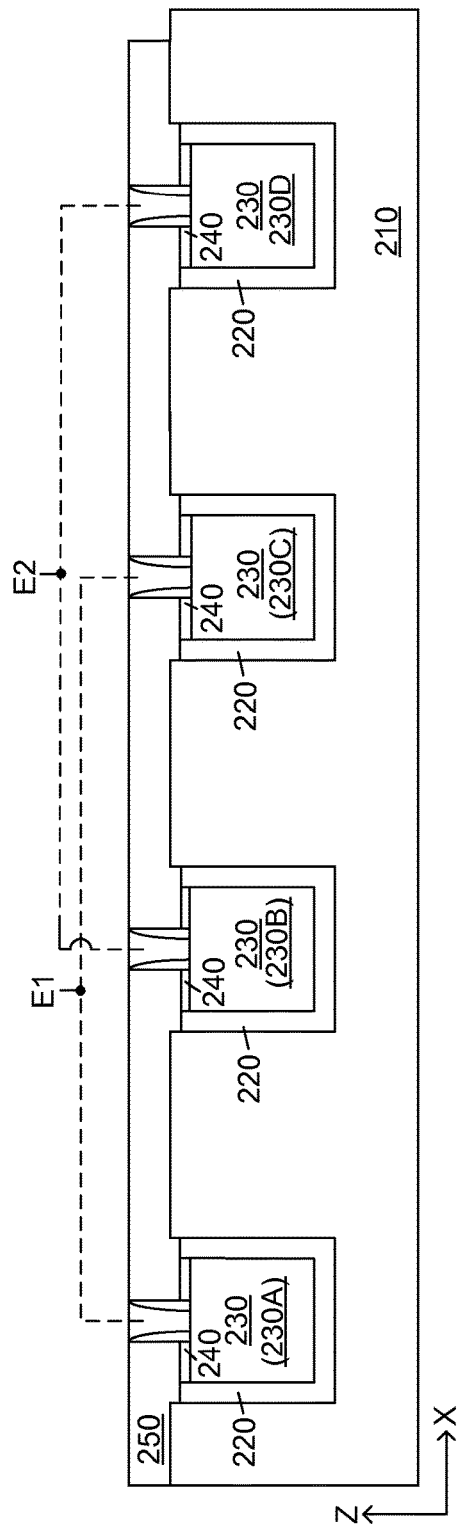
FIG. 15B shows a semiconductor structure in accordance with an embodiment of the present invention.

FIGS. 15A,B show other possible ways of forming a capacitor within the substrate 210. Referring to FIG. 15A, the conductive layers 230A and 230C may be electrically coupled together and may serve as capacitor plates for a first capacitor electrode E1. The conductive layer 230B may serve as a capacitor plate that forms the second capacitor electrode E2. The dielectric layer 220 may serve as the capacitor dielectric. In another embodiment, it is possible that counter-doped regions may be added and/or that the dielectric layers 220 be removed. Referring to FIG. 15B, additional conductive layers 230 (e.g. capacitor plates) may be formed. FIG. 15B shows an additional conductive layer 230D. In this example, conductive layer 230A and 230C may be electrically coupled together to form a capacitor electrode E1 while the conductive layers 230B and 230D may be electrically coupled together to form a second capacitor electrode E2.

Hence, at least one capacitor may thus be formed within the substrate 210. The capacitor may include a first capacitor electrode spacedly disposed from a second capacitor electrode. In one or more embodiments, as shown in FIG. 14A, the first capacitor electrode may be formed from one or more conductive layers 230 (e.g. first capacitor plates). The second capacitor electrode may be formed from one or more counter-doped regions 214 (e.g. second capacitor plates) that may be formed within the substrate.

The capacitor that is formed within the substrate 210 may, for example, be substantially enclosed by a semiconductor material. In one or more embodiments, the semiconductor material may include a monocrystalline silicon material. The semiconductor material may underlie, overlie and laterally surround the capacitor. A portion of the semiconductor material may be semiconductor material from the substrate 210 while a portion of the semiconductor material may be semiconductor material from semiconductor layer 250.

The capacitor formed within the substrate is an example of a device formed within the substrate. As will be explained below other types of devices may be formed within the substrate 210. Hence, in one or more embodiments, it may be possible to form other devices within the substrate. A device formed within the substrate 210 may be referred to a first device.

Figure 16A:
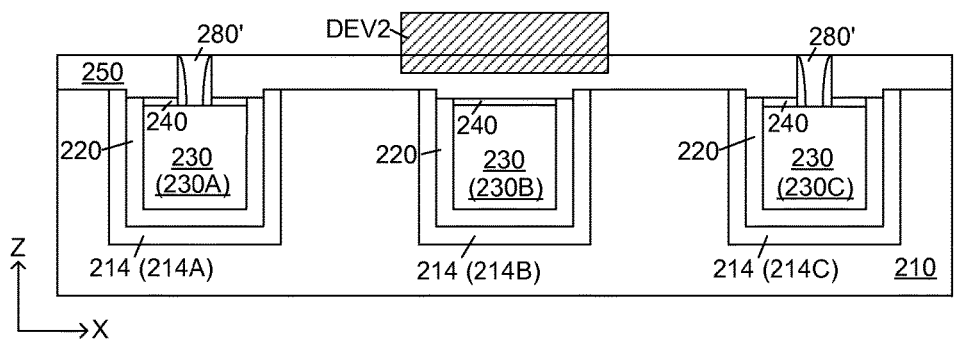
FIG. 16A shows a cross sectional view of a semiconductor structure in accordance with an embodiment of the present invention.
Figure 16B:
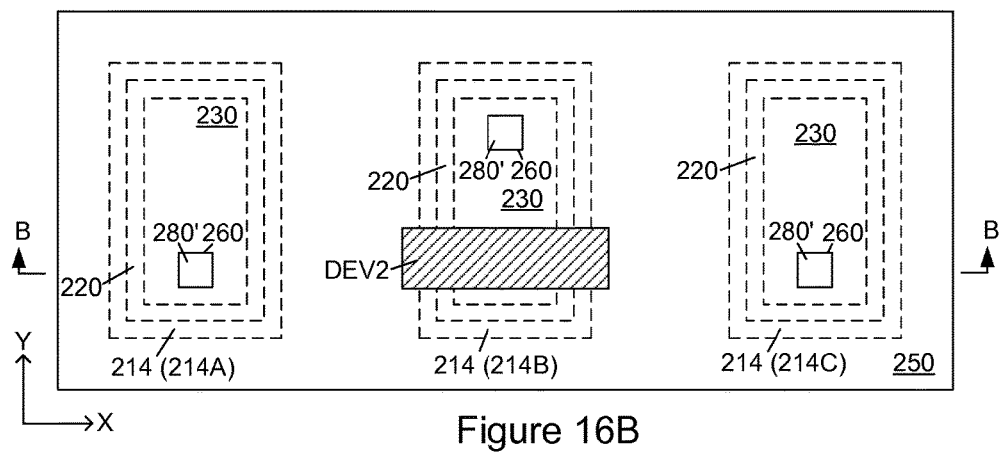
FIG. 16B shows a top view of the structure shown in FIG. 16A.

Referring now to FIGS. 16A,B. FIG. 16A is a cross sectional view of a structure in an XZ plane while FIG. 16B is a top view in an XY plane. FIG. 16A is a cross section from FIG. 16B through the cross section BB. Referring to FIGS. 16A,B, it is again noted that layer 250 (e.g. a semiconductor layer) may be formed (e.g. deposited and/or grown) so as to overlie the top surface of the substrate 210 as well as to overlie the capacitor (or more than one capacitor). A device DEV2, also referred to herein as a second device DEV2, may be formed so that at least a portion of the second device DEV2 is formed within the layer 250 (e.g. semiconductor layer 250). Hence, a second device DEV2 may be formed such that at least a portion of the second device DEV2 lies within the semiconductor layer 250. It is particularly noted that the second device DEV2 may occupy a portion of the semiconductor layer 250 that grew or spilled over to at least partially close the opening 212 and/or that grew or spilled over to overlie the conductive layer 230. Hence, the second device DEV2 may occupy a portion of the semiconductor layer 250 that at least partially closed the opening 212 and/or that overlies the conductive layer 230 (e.g. overlies at least a portion of the conductive layer 230).

It is noted that at least a portion of the second device DEV2 may also overlie the layer 250. For example, the second device DEV2 may be a transistor (such as bipolar or MOS transistor) that may be formed such that a portion of a transistor lies within the semiconductor layer 250 and a portion lies over the semiconductor layer 250. For example, the source and drain regions of a MOS transistor may be formed within the semiconductor layer 250 while the gate stack of the MOS transistor be formed over the semiconductor layer 250.

Still referring to FIGS. 16A,B, it is also possible that the second device DEV2 be formed so that the second device DEV2 (e.g. a least a portion of the second device DEV2) overlies the conductive layer 230 (e.g. at least a portion of the conductive layer 230. In one or more embodiments, it may be the case that the second device DEV2 overlies one or more of the first conductive layers 230 (which serve as first conductive plates) of the capacitor. In one or more embodiments, it may be the case that the second device DEV2 may overlie one or more of the second conductive plates 214 of the capacitor.

The second device DEV2 may be any type of device. The second device DEV2 may be an electronic device. The second device DEV2 may be a semiconductor device. The second device DEV2 may be an active device. The second device DEV2 may be a passive device. The second device DEV2 may be a memory device or a logic device. Examples of second device DEV2 include, but not limited to, transistor (MOS or bipolar), memory device (e.g., charge storage memory, floating gate memory, phase change memory, magnetic memory, etc.), capacitor, inductor, resistor, etc. It is possible that the second device DEV2 be electrically coupled to the capacitor formed within the substrate 210.

As noted above, the capacitor shown, for example, in FIGS. 16A,B, may be replaced with any other type of device. This is shown in FIGS. 16C,D where the capacitor from FIGS. 16A,B has been replaced with a first device DEV1 that may be formed within the substrate 210. FIG. 16C is a cross-section view in an XZ plane while FIG. 16D is a top view in an XY plane of the structure shown in FIG. 16C. FIG. 16C is a cross-sectional view through the cross-section BB of FIG. 16D. The first device DEV1 may be a capacitor or it may be any other type of device. The first device DEV1 may be an electronic device. The first device DEV1 may be a semiconductor device. The first device DEV1 may be an active device. The first device DEV1 may be a passive device. The first device DEV1 may be a memory device or a logic device. Examples of first device DEV1 include, but not limited to, transistor (MOS or bipolar), memory device (e.g., charge storage memory, floating gate memory, phase change memory, magnetic memory, etc.), capacitor, inductor, resistor, etc. As shown in FIG. 16C, in some embodiments, at least a portion of the first device DEV1 may be formed within the opening 212.

In one or more embodiments, the first device DEV1 may be substantially enclosed by at least one semiconductor material. In one or more embodiments, a semiconductor material may overlie, underlie and laterally surround the first device DEV1. In one or more embodiments, a semiconductor material may comprise monocrystalline silicon.

The second device DEV2 may be formed so that at least a portion of the second device DEV2 is formed within the layer 250 (e.g. a semiconductor layer). For example, in one or more embodiments, at least a portion of the second device DEV2 may be formed in that portion of the semiconductor layer 250 that epitaxially grew so as to spill over and overlie the device DEV1. The second device DEV2 may overlie the device DEV1 (e.g. at least a portion of the second device may overlie at least a portion of the device DEV1). In one or more embodiments, the second device DEV2 may overlie a portion of device DEV1. In one or more embodiments, the second device DEV2 may overlie substantially all of the device DEV1. In the embodiment shown in FIGS. 16C,D, the second device DEV2 overlies first device DEV1. In particular, second device DEV2 overlies a portion 610 of first device DEV1. In one or more embodiments, the lateral footprint of the second device DEV2 may overlap the lateral footprint of the first device DEV1.

In one or more embodiments, the second device DEV2 may be formed within and/or over the semiconductor layer 250. In one or more embodiments, at least a portion of the second device DEV2 may be formed within the semiconductor layer 250. In one or more embodiments, it may also be possible, that the second device DEV2 may only overlie the semiconductor layer 250 and/or first device DEV1 without also be formed within semiconductor layer 250.

FIGS. 17 through 29 show another process for making a semiconductor structure in accordance with an embodiment of the present invention.

Figure 17:
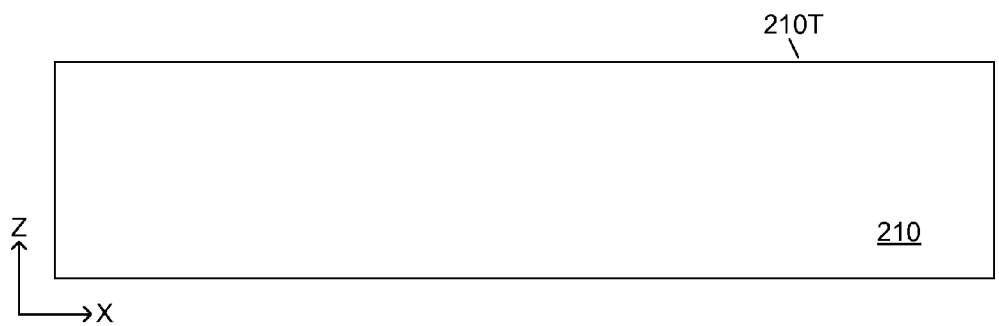
FIGS. 17 through 29 show methods of making semiconductor structures in accordance with embodiments of the present invention.

FIG. 17 shows a substrate 210. The substrate 210 has a top surface 210T. The substrate 210 has been described above and the same discussion applies here. As described above, the substrate 210 may be any type of substrate. In one or more embodiments, the substrate 210 may be a semiconductor substrate. In one or more embodiments, the semiconductor substrate may be a bulk semiconductor substrate such as a bulk silicon substrate (e.g. a bulk monocrystalline silicon substrate). In one or more embodiments, the semiconductor substrate may be an SOI substrate which may include a bulk semiconductor substrate (e.g. a bulk silicon substrate), an insulting layer overlying the bulk semiconductor substrate and a semiconductor layer (e.g. a silicon layer) overlying the insulating layer. The SOI substrate may, for example, be formed by a SIMOX process. In one or more embodiments, the semiconductor substrate may be a silicon-on-sapphire (SOS) substrate or a germanium-on-insulator (GeOI) substrate. In one or more embodiments, the semiconductor substrate may include one or more semiconductor materials such as silicon, silicon germanium, germanium, germanium arsenide, indium arsenide, indium arsenide, indium gallium arsenide, or indium antimonide. In some embodiments, the substrate 210 may include an epitaxial layer. In some embodiments, the substrate 210 may be a wafer such as a semiconductor wafer. The semiconductor wafer may be a silicon wafer.

Figure 18A:
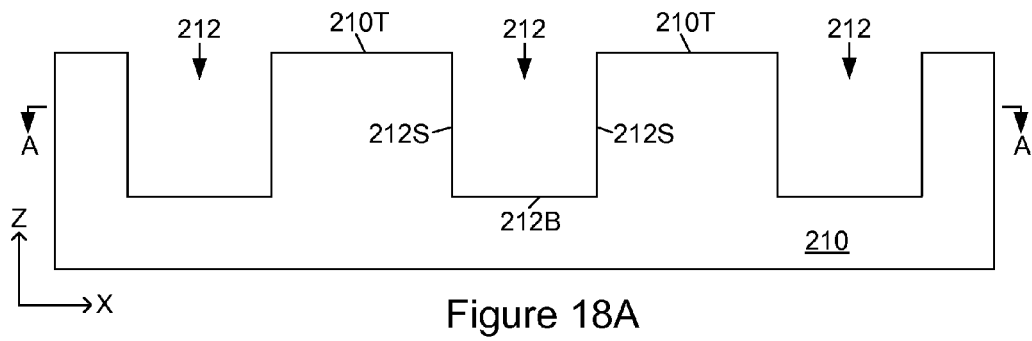
Figure 18B:
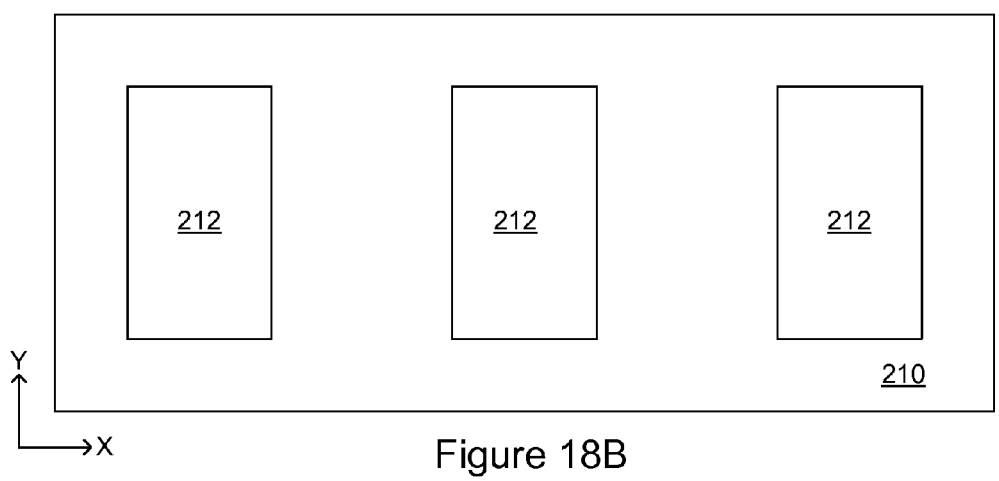

Referring to FIG. 18A, at least one opening 212 or a plurality of openings 212 may formed within the substrate 210. FIG. 18B shows a lateral cross-sectional view in an XY plane through the cross-section AA of the structure shown in FIG. 18A. The opening 212 have been discussed above, the same discussion applies here.

Figure 18C:
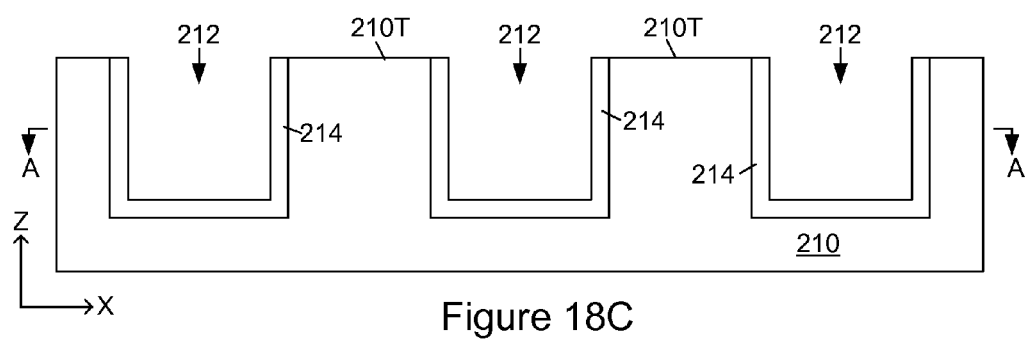
Figure 18D:
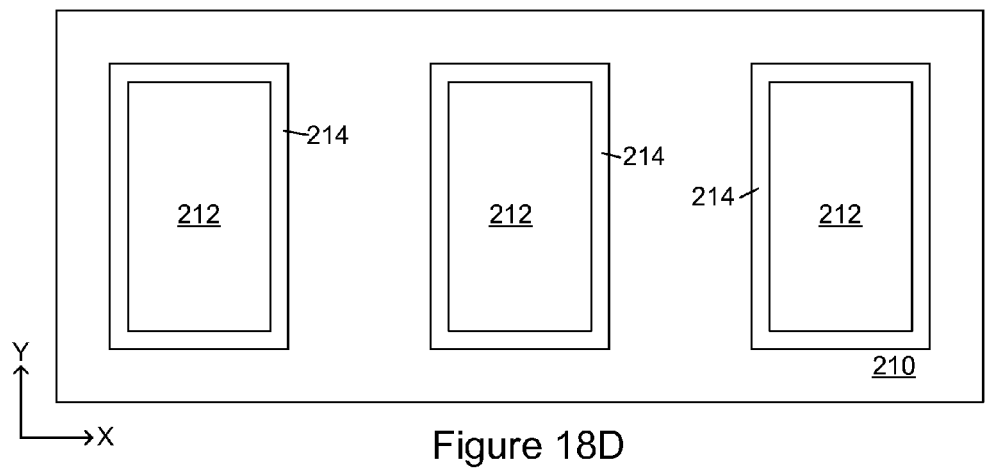
Figure 19:
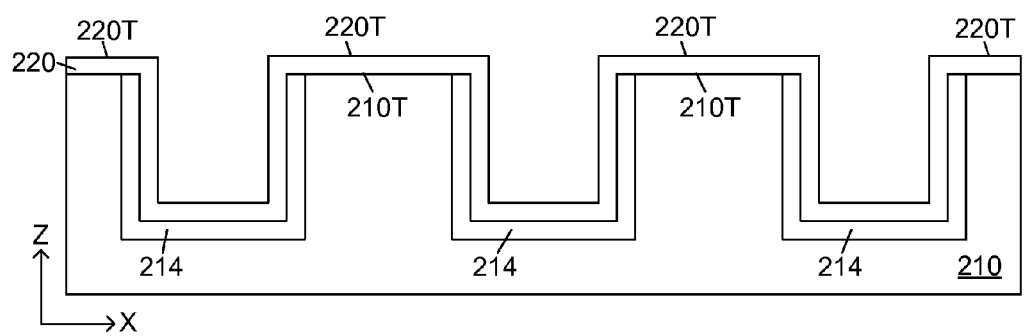

Referring to FIGS. 18C, 18D, as an optional step, after the formation of the openings 212, the substrate 210 may be counter-doped so as to create counter-doped regions 214 in the substrate about the bottom surface and sidewall surfaces of each of the openings 212. Counter-doped regions 214 have been described above and the discussion applies here as well. For example, if the substrate is a p-type silicon substrate, the substrate may be counter-doped with an n-type dopant to create n-type regions 214 within the p-type substrate 210. As another example, if the substrate is an n-type silicon substrate, it may be possible that the substrate 210 may be counter-doped with a p-type dopant to create p-type regions 214 within the n-type substrate 210. As noted above, the counter-doping process is optional. The counter-doped regions 214 may be formed before the formation of the dielectric layer 220 that are shown in FIG. 19. FIG. 18D is a lateral cross sectional view (in an XY plane) through the cross section AA shown in FIG. 18C.

Referring to FIG. 19, in one or more embodiments, a dielectric layer 220 may be formed over the top surface 210T of the substrate 210 as well as within the openings 212. The dielectric layer 220 may be formed over the sidewall and bottoms surfaces of openings 212. The dielectric layer 220 may be deposited by a substantially conformal deposition. The dielectric layer 220 may line the openings 212. As described above, in some embodiments, the dielectric layer 220 may comprise one or more dielectric materials such as an oxide (such as silicon oxide), a nitride (such as silicon nitride), an oxynitride (such as silicon oxynitride), or combinations thereof. The dielectric layer 220 may comprise a stack of two or more dielectric sub-layers. Two or more of the dielectric sub-layers may include a different dielectric material. For example, the dielectric layer 220 may comprises an ONO stack comprising a nitride sub-layer sandwiched between two oxide sub-layers.

Figure 20:
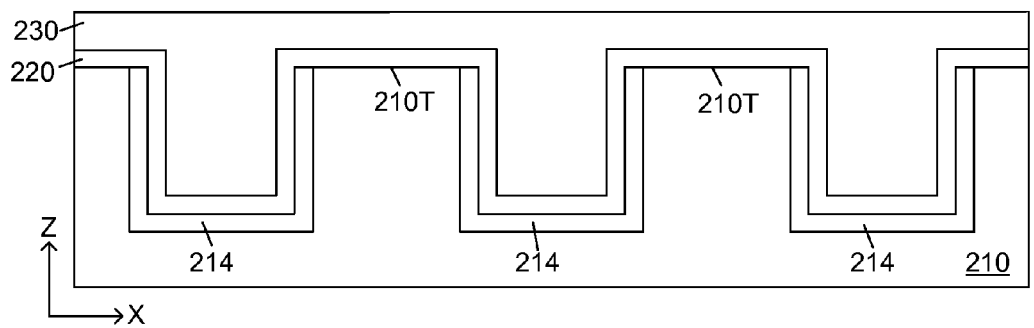

Referring to FIG. 20, a conductive layer 230 may be formed over the dielectric layer 220. The conductive layer 230 has been described above and the discussion is applicable here. As discussed, the conductive layer 230 may comprise one or more conductive materials. The conductive layer 230 may comprise polysilicon such as a doped polysilicon. The doped polysilicon may be p-doped or n-doped. The doping may be done in-situ or it may be introduced such as a by ion implantation or diffusion. In one or more embodiments, the conductive layer 230 may comprise a metallic material such as a metal, a metal alloy or a metallic compound.

It is understood that conductive layer 230 may be deposited as a conductive layer or it may be made conductive in a later processing step. For example, the conductive layer 230 may be deposited as a doped polysilicon which is doped in-situ. Likewise, the layer 230 may be deposited as undoped polysilicon which is then doped using, a doping process such as ion implantation or diffusion or some other means.

Figure 21:
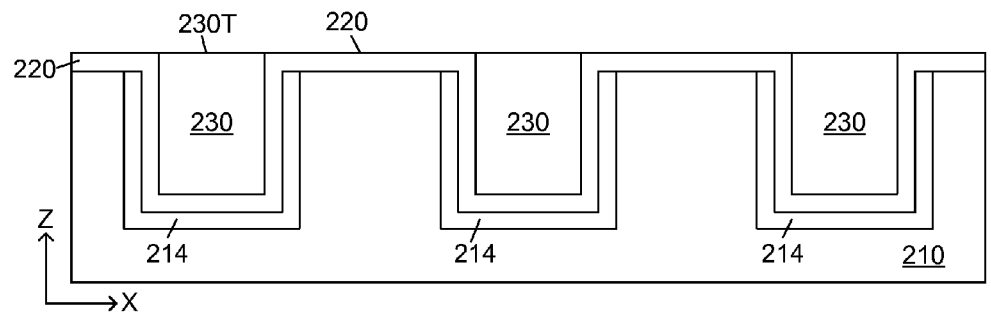

Referring to FIG. 21, a portion of the conductive layer 230 shown in FIG. 20 may be removed to form the structure shown in FIG. 21. In one or more embodiments, the removal may comprise an etching process. In one or more embodiments, the etching may comprise a dry etching process such as a plasma etch. In one or more embodiments, the etching process may comprise a wet etching process. In one or more embodiments, the etching process may include an etch-back process. In one or more embodiments, the removal may include a chemical mechanical polishing process. In one or more embodiments, the removal process may remove the conductive layer 230 from the top surfaces 220T of the dielectric layer 220 but leave at least a portion of the conductive layer 230 within the openings 212. In one or more embodiments, the top surface 230T of each of the conductive layers 230 may be below that of the top surface 220T of the dielectric layer 220. In one or more embodiments, the top surface of each of the conductive layers 230 may be substantially flush with the top surface 220T of the dielectric layer 220.

Figure 22A:
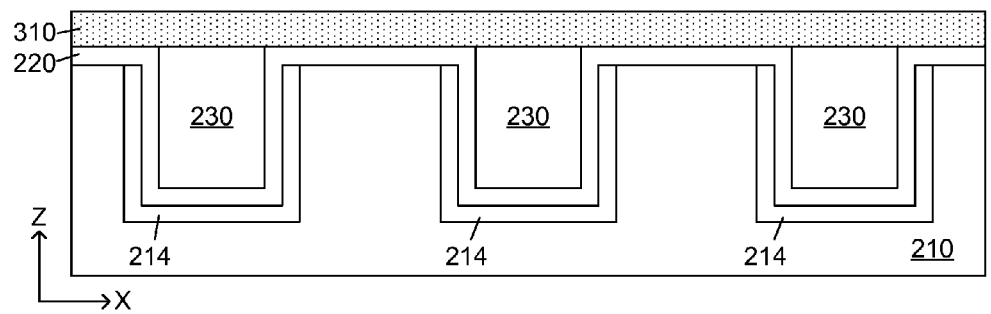
Figure 22B:
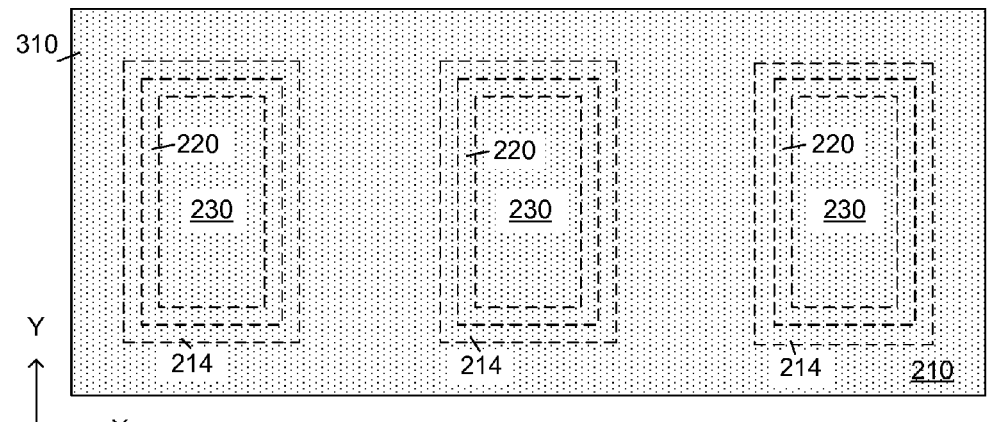

Referring to FIG. 22A, a masking layer 310 may be formed over the structure shown in FIG. 21 to form the structure shown in FIG. 22A. The masking layer 310 may be formed over the top surface of the layer 220 as well as over the top surface of the layers 230. FIG. 22B shows a top view (in an XY plane) of the structure of FIG. 22A.

In the embodiment shown in FIG. 22B, the masking layer 310 may overlie substantially all of each of the openings 212, substantially all of each of the conductive layers 230, substantially all of each of the dielectric layers 220 and substantially all of the counter-doped regions 214. In one or more embodiments, the masking layer 310 may be a photoresist layer.

Figure 23A:
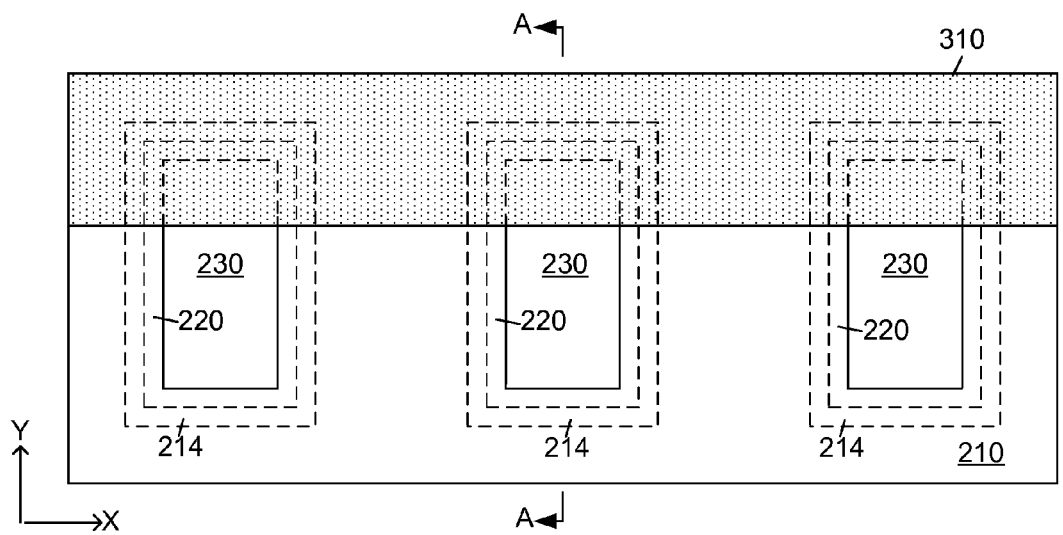

Referring to FIG. 23A, still shows a top view in an XY plane, the masking layer 310 may then be patterned so that a portion of the masking layer 310 is removed and that a portion remains. The remaining portion of masking layer 310 may be in the form of a strip which runs, for example, in a direction substantially perpendicular to the elongated dimension (or length dimension) of the conductive layers 230 (which corresponds the elongated or length dimension of the openings 212). Referring to FIG. 23A, it is seen that, in one or more embodiments, the elongated direction (or length dimension) of the openings 212 (shown, for example, in FIGS. 18C,D) or of the conductive layers 230 may be in the Y-direction. Hence, the remaining strip of masking layer 310 may have a length that extends in the X-direction. Hence, the remaining portion of masking layer 310 may extend lengthwise in a direction substantially perpendicular to the length of the openings 212. The remaining portion of masking layer 310 may thus overlie a portion (e.g. a portion in the length or Y-direction) of each of the openings 212 and of each of the conductive layers 230 and of each of the counter-doped regions 214.

Figure 23B:
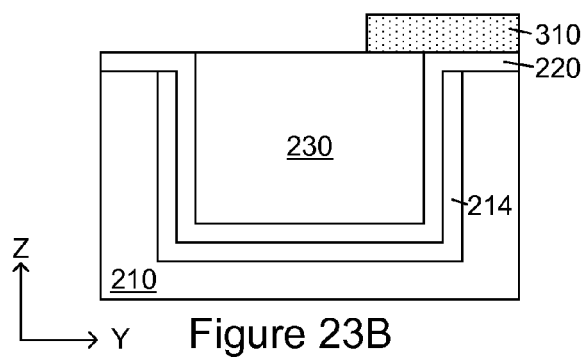

FIG. 23B shows a cross-sectional view of the structure shown in FIG. 23A along the cross section AA. The cross sectional view shown in FIG. 23B is in a YZ plane.

Referring to FIG. 23B, a portion of the conductive layer 230 has been exposed upon removal of a portion of the masking layer 310. Likewise, a portion of the conductive layer 230 may remain covered by the masking layer 310.

Figure 24:
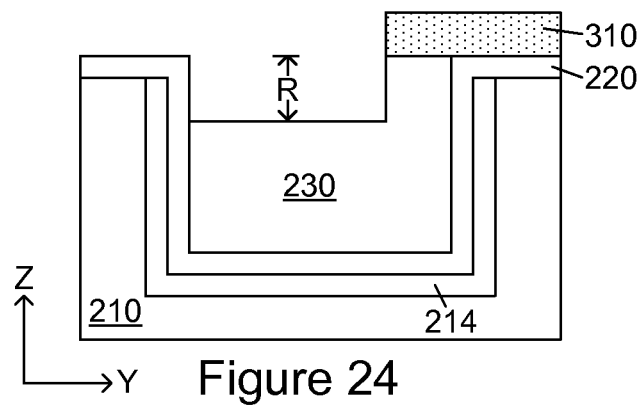

Referring to FIG. 24, using the remaining portion of the masking layer 310 as a mask, the conductive layer 230 may then be etched to create a recess R in the conductive layer 230. In one or more embodiments, the recess R may be formed in a portion of the conductive layer 230 that is not covered by the masking layer 310. The recess R in the conductive layer 230 may be formed using an etching process. The etching process may include a dry etching process such as a plasma etching process.

Figure 25:
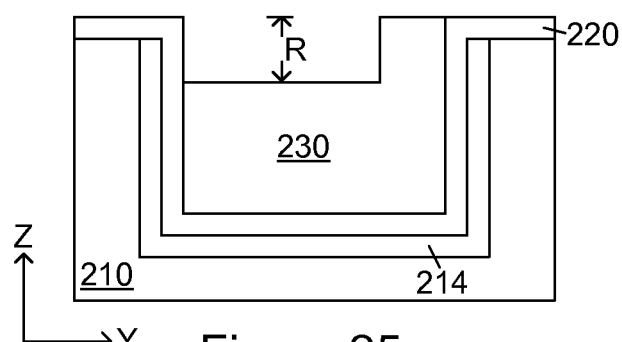

Referring to FIG. 25, after forming the recess R, the remainder of the masking layer 310 may be removed. The recess R in the conductive layer 230 remains.

Figure 26:
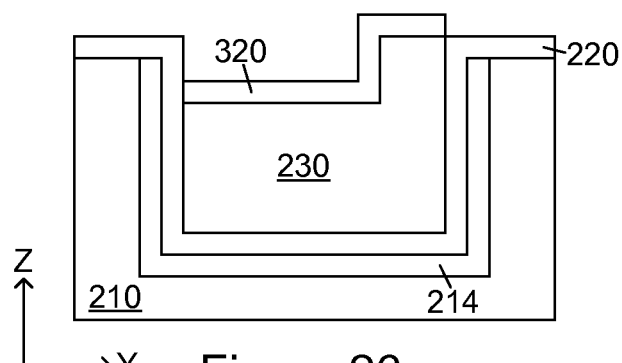
Figure 27:
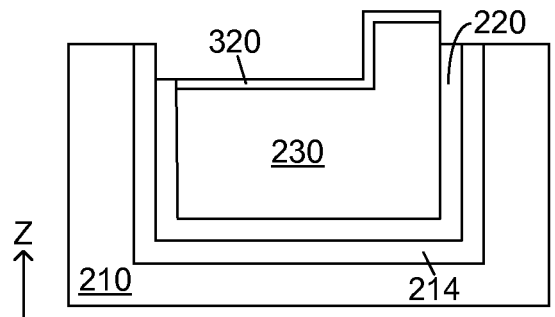

Referring to FIG. 26, a layer 320 may be formed over the conductive layer 230. In one or more embodiments, the layer 320 may be a dielectric layer. The layer 320 may comprise one or more dielectric materials such as an oxide, nitride, oxynitride, or combinations thereof. It may be possible that the layer 320 comprise a plurality of sub-layers (such as a plurality of dielectric sub-layers). The layer 320 may serve to protect the conductive layer 230 during the removal (for example, by etching) of a portion of the layer 220 (as shown in FIG. 27 and explained below). In the embodiment shown in FIG. 26, the layer 320 may not be formed over the dielectric layer 220 so that the dielectric layer 220 may remain exposed.

Referring to FIG. 27, a portion of the dielectric layer 220 may be removed. The removed portion may include that portion which is exposed. The exposed portion may include that portion which overlies a top surface of the substrate 210.

A portion of dielectric layer 220 may be removed by one or more etching processes. The etching processes may comprise one or more wet etching processes. The etching processes may comprise one or more dry etching processes. The etching processes may comprise one or more etching chemistries. For example, in one or more embodiments, the dielectric layer 220 may comprise an ONO layer comprising an oxide-nitride-oxide sandwich. In this case, it is possible that at least two etch chemistries may be used, one to etch the oxide sub-layers and one to etch the nitride sub-layer.

Referring to FIG. 27, it is seen that the layer 320 may be thinned during the etching of dielectric layer 220. In one or more embodiments, the thickness of layer 320 prior to etching the dielectric layer 220 (as shown in FIG. 26) may be thick enough so that some of the layer 320 still remains (and still covers conductive layer 230) after the exposed portion of dielectric layer 220 is removed (as shown in FIG. 27).

Figure 28:
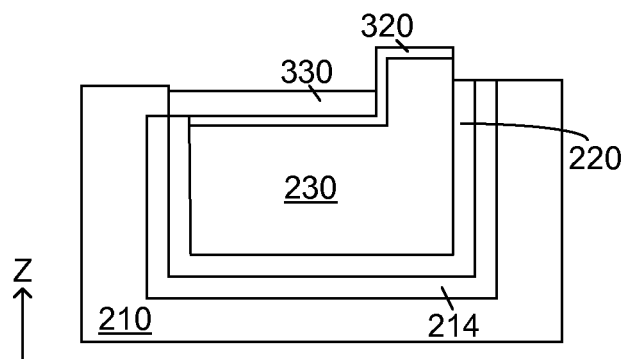

Referring to FIG. 28, a semiconductor layer 330 may be formed within the recess R. A semiconductor layer 330 may be formed over the dielectric layer 320 and may overlie the dielectric layer 320 (e.g. the dielectric layer 320 may overlie at least a portion of the dielectric layer 320). The semiconductor layer 330 may overlie at least that portion of the dielectric layer 320 which underlies the recess R. The semiconductor layer 330 may also overlie the conductive layer 230 (for example, the semiconductor layer 330 may overlie at least a portion of the conductive layer 230). In one or more embodiments, the semiconductor layer 330 may overlie substantially all of the conductive layer 230.

In one or more embodiments, the semiconductor layer 330 may be formed by a reflow process. The reflowed semiconductor layer 330 may at least partially fill the recess R. In one or more embodiments, the semiconductor layer 330 may be a silicon layer. In one or more embodiments, the semiconductor layer 330 may be a monocrystalline silicon layer. The silicon layer 330 may be formed by a silicon reflow process. In one or more embodiments, the silicon reflow process may be a hydrogen ambient bake process.

Referring again to FIG. 27, in one or more embodiments, the substrate 210 may a monocrystalline silicon substrate (e.g. a bulk monocrystalline silicon substrate). In one or more embodiments, in a silicon reflow process (for example, a hydrogen ambient bake process), the structure shown in FIG. 27 may be heated in a hydrogen atmosphere. In one or more embodiments, the hydrogen may be utilized to increase the mobility (e.g. surface mobility) of the silicon atoms. In some embodiments, the temperature of the process may be about 800° C. or greater. In some embodiments, the temperature of the process may be about 900° C. or greater. In some embodiments, the temperature of the process may be about 1000° C. or greater. In some embodiments, the temperature of the process may be less than about 1200° C. In some embodiments, the duration of the process may be about 10 seconds or greater. In some embodiments, the duration of the process may be about 15 seconds or greater. In some embodiments, the duration of the process may be less than about 20 minutes. In some embodiments, the duration of the process may be less than about 10 minutes. In some embodiments, the duration of the process may be less than about 5 minutes. In some embodiments, the duration of the process may be less than about 2 minutes. In some embodiments, during a hydrogen ambient bake process, hydrogen may be utilized to increase the surface mobility of the silicon atoms.

Referring to FIG. 28, the silicon reflow process may cause a portion of the silicon (e.g. monocrystalline silicon) from the substrate 210 (which may include counter-doped region 214) to redistribute and fill at least a portion of recess R. The reflowed silicon 330 may overlie at least a portion of the dielectric layer 320 and may overlie at least a portion of the conductive layer 230. It is noted that the reflowed silicon layer 330 may at least partially close the opening 212. In some embodiments, the reflowed silicon layer 330 may substantially close the opening 212. It is understood that that the opening 212 may be closed around the contact surface 230' (as surface of conductive layer 230) shown in FIG. 29. Hence, even through there may be a contact surface 230' sticking out from the opening 212, the opening may still be considered to be substantially closed by the reflowed silicon layer 330.

The reflowed silicon (e.g. bulk monocrystalline silicon) is shown in FIG. 28 as the silicon layer 330 (e.g. monocrystalline silicon layer 330). The substrate 210 may be a monocrystalline silicon substrate so that the reflowed silicon layer 330 may be a monocrystalline silicon layer.

The monocrystalline silicon layer 330 may already include the dopants (if any) from the substrate 210. However, in one or more embodiments, the monocrystalline silicon layer 330 may, optionally, be doped (or additionally doped) with n-type dopant or p-type dopant. The silicon layer 330 may possibly be doped during the reflow process or after the reflow process. Doping may be by any means such as implantation or diffusion. In one or more embodiments, the monocrystalline silicon layer 330 may be doped the same as the substrate 210. Hence, in one or more embodiments, if the substrate 210 is p-doped) then the silicon layer 330 may also be p-doped. Likewise, in one or more embodiments, if the substrate 210 is n-doped, then the silicon layer 330 may also be n-doped.

In other embodiments, it may be possible that the reflowed layer 330 comprise some other semiconductor material.

Figure 29:
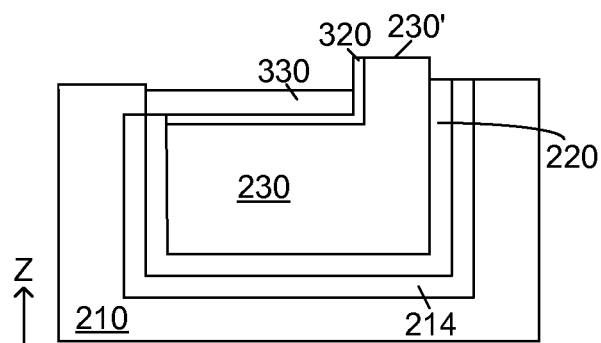

The structure shown in FIG. 28 may be etched or chemically mechanically polished so as to expose a surface 230' of the conductive layer 230. Hence, a portion of the layer 320 may be removed to expose the conductive layer 230. This is shown in FIG. 29. The exposed surface 230' may serve as an electrical contact surface. This may permit electrical contact to the conductive layer 230.

The conductive layer 230 shown in FIG. 29 may form a conductive plate for a capacitor. Likewise, the counter-doped region 214 may form a corresponding opposite capacitor plate for a capacitor. The dielectric layer 220 may form a capacitor dielectric.

Figure 30A:
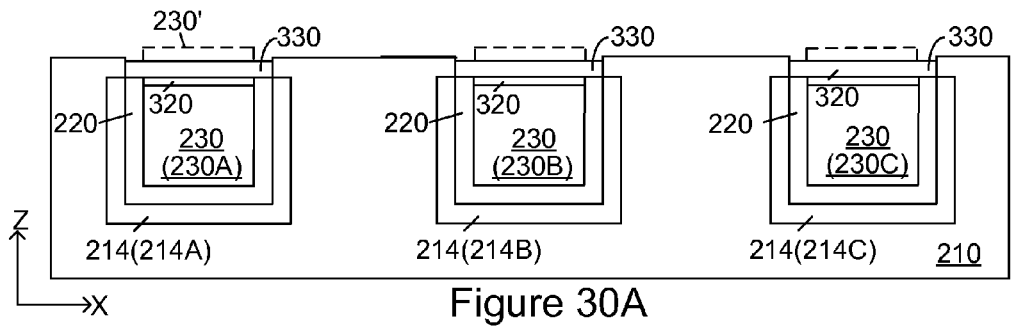
FIG. 30A shows a semiconductor structure in accordance with an embodiment of the present invention.

Referring to FIG. 30A, conductive layers 230 are shown as conductive layers 230A,B,C. Each of the conductive layers 230A,B,C may be viewed as a first capacitor plate. The counter-doped regions 214 are shown as counter-doped regions 214A,B,C. Each of the counter-doped regions 214A, B,C may be a corresponding second plate of a capacitor. FIG. 30A shows the reflowed semiconductor layers 330 (which may be monocrystalline silicon layers).

Figure 30B:
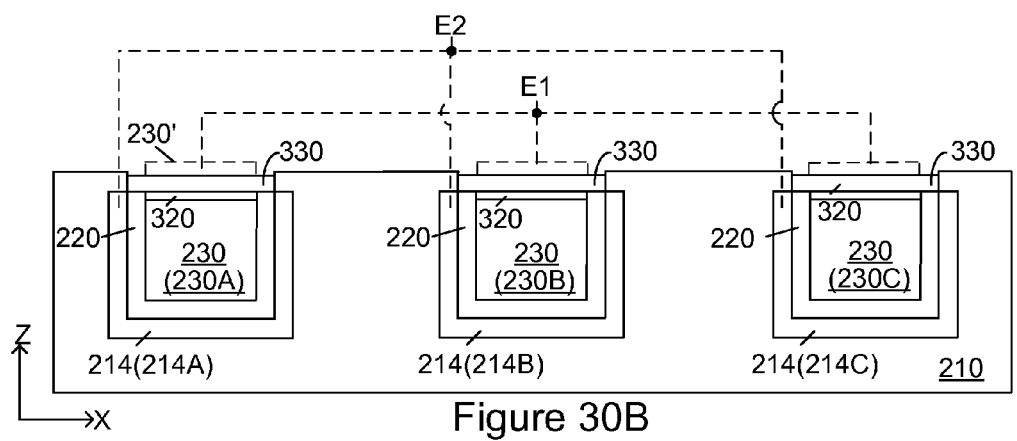
FIG. 30B shows a semiconductor structure in accordance with an embodiment of the present invention.

Referring to FIG. 30B, the conductive layers 230A,B,C (e.g. first capacitor plates) may all be electrically coupled together to form a first capacitor electrode E1 of a capacitor. The counter-doped regions 214 (e.g. second capacitor plates) may be electrically coupled together to form a second capacitor electrode E2 of a capacitor. The dielectric layers 220 may serve as the capacitor dielectric. A first electrode E1 may include at least one first capacitor plate 230. A second electrode E2 may include at least one second capacitor plate 214. Coupling may be accomplished, for example, by using metallization levels formed over the substrate 210 (e.g. metal lines, conductive vias, etc.). Coupling may also be accomplished by using one or more conductive channels formed within the substrate 210 (explained below).

Figure 30C:
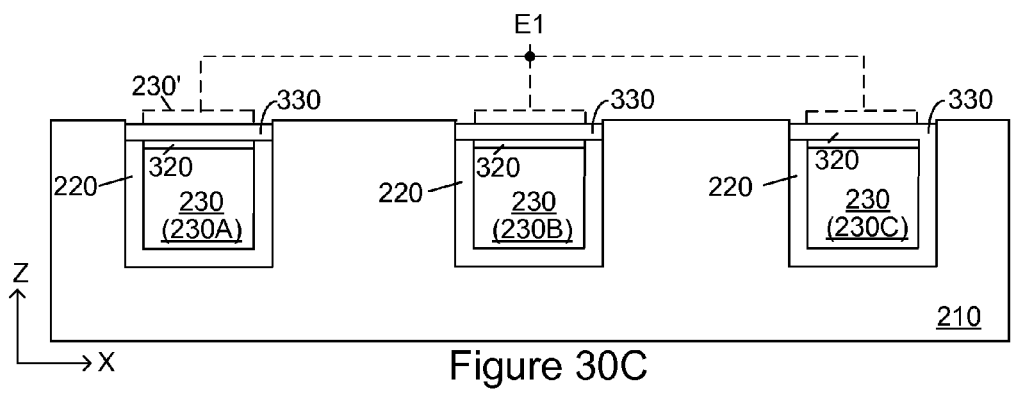
FIG. 30C shows a semiconductor structure in accordance with an embodiment of the present invention.

Referring to FIG. 30C, in one or more embodiments, it may be possible that the substrate 210 may instead serve as the second capacitor electrode E2.

In some embodiments, the electrical coupling of conductive layers 230A,B,C (as well as the counter-doped regions 214) may be accomplished, for example, using metallization structures (e.g. metal lines, conductive vias, etc.) formed over the substrate 210. However, in some embodiments, it may also be possible to electrically couple the conductive layers 230A,B,C (as well as the counter-doped regions) using one or more conductive channels formed within the substrate.

Figure 30D:
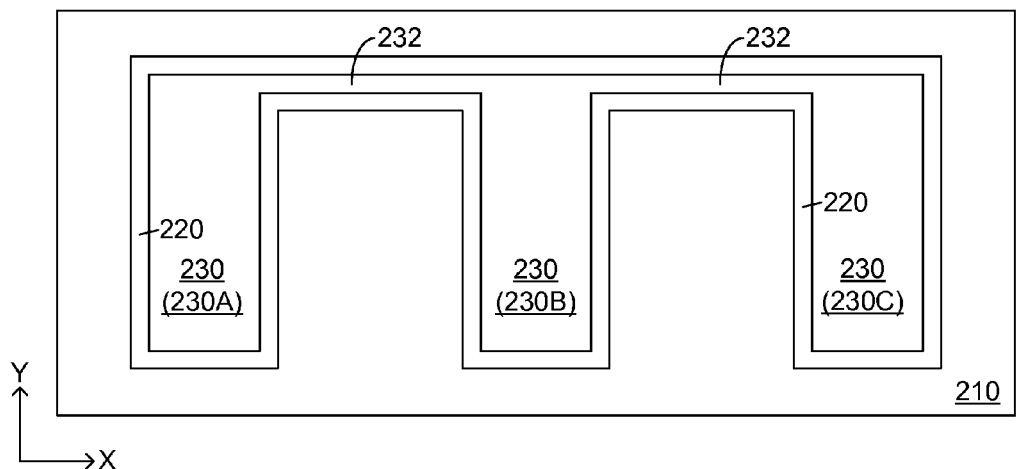
FIG. 30D shows a semiconductor structure in accordance with an embodiment of the present invention.

FIG. 30D shows an embodiment using a conductive channel 232 formed within the substrate that may be used to electrically couple the conductive layers 230A,B,C. FIG. 30D shows a lateral cross-sectional view in an XY plane. The conductive channel 232 may run substantially perpendicular to the conductive layers 230A,B,C. The dielectric layer 220 may electrically isolate the conductive channel from the substrate 210. The conductive channel 232 may comprise, for example, polysilicon (e.g. doped polysilicon). For simplicity, the counter-doped regions 214 are not shown in FIG. 30D, but it is understood that, in or more embodiments, they may also be included. In one or more embodiments, the conductive layers 230A,B,C may be substantially parallel to each other. The conductive channel 232 may be electrically coupled to circuitry above the substrate 210.

Figure 31:
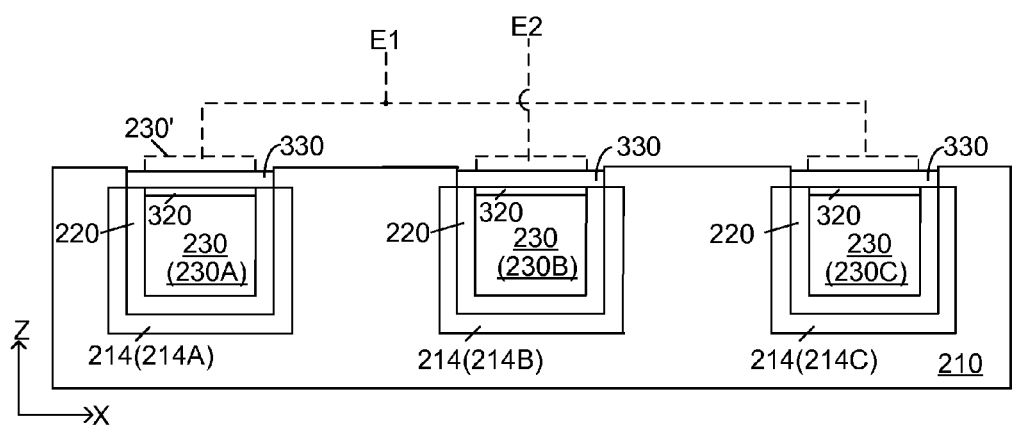
FIG. 31 shows a semiconductor structure in accordance with an embodiment of the present invention.

Referring to FIG. 31, a plurality of conductive layers 230 (e.g. 230A, 230B and 230C) may be formed and the conductive layers 230 (e.g. capacitor plates) may be appropriately coupled together to form first and second capacitor electrodes E1 and E2, respectively. In the embodiment shown in FIG. 31, capacitor plate 230A is coupled to capacitor plate 230C to form a first capacitor electrode. Capacitor plate 230B may form the second capacitor electrode. The dielectric layer 220 may serve as at least a portion of the capacitor dielectric. An alternate configuration similar to that shown in FIG. 15B is also possible.

In one or more embodiments, a capacitor may be formed within the substrate 210 which is substantially enclosed by at least one semiconductor material. The semiconductor material may include silicon (e.g. monocrystalline silicon). In one orm or more embodiments, the semiconductor material may overlie, underlie and laterally surround the capacitor. Referring, for example, to FIGS. 30A,B,C, a portion of the semiconductor material may come from the substrate 210 and a portion may come from the semiconductor layer 330.

Figure 32A:
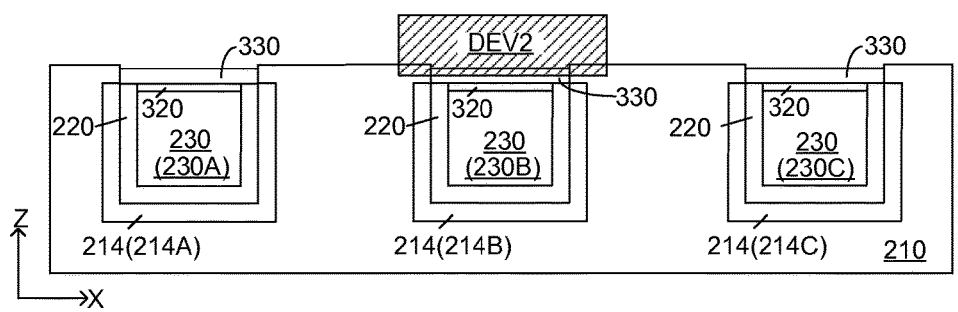
FIG. 32A shows a cross sectional view of a semiconductor structure in accordance with an embodiment of the present invention.
Figure 32B:
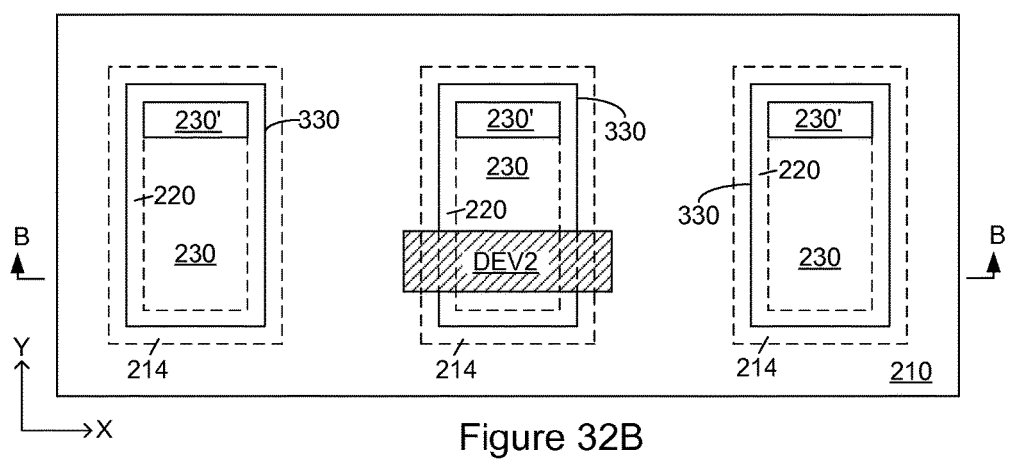
FIG. 32B shows a top view of the structure shown in FIG. 32A.

Referring now to FIGS. 32A,B. FIG. 32A is a cross sectional view of a structure in an XZ plane while FIG. 32B is a top view in an XY plane. FIG. 32A is a cross section from FIG. 32B in the cross section BB. Referring to FIGS. 32A,B, it is again noted that layer 330 may be a semiconductor layer. The semiconductor layer may be a silicon layer (for example, a monocrystalline silicon layer) that may be formed by a reflow process. The layer 330 may overlie the layer 230 (e.g. the layer 330 may overlie at least a portion of the layer 230).

A device DEV2, also referred to as a second device DEV2, may be formed so that at least a portion of the second device 410 is formed within the layer 330 (e.g. a semiconductor layer such as a monocrystalline silicon layer). Hence, a second device DEV2 may be formed such that at least a portion of the second device DEV2 lies within the semiconductor layer 330 (e.g. a monocrystalline silicon layer). For example, the second device DEV2 may be a transistor (such as bipolar or MOS transistor) may be formed such that at least a portion of a transistor lies within the silicon layer 330. For example, the source and drain regions of a MOS transistor may be formed within the layer 330. It is possible that the gate stack of the MOS transistor be formed over the layer 330.

Still referring to FIGS. 32A,B, the second device DEV2 may be formed so that the second device DEV2 overlies the conductive layer 230 (e.g. DEV2 may overlie at least a portion of the conductive layer 230). The second device DEV2 may be any type of device. The second device DEV2 may be an electronic device. The second device DEV2 may be a semiconductor device. The second device DEV2 may be an active device. The second device DEV2 may be a passive device. The second device DEV2 may be a memory device or a logic device. Examples of second device DEV2 include, but not limited to, transistor (MOS or bipolar), memory device (e.g., charge storage, floating gate, phase change memory, magnetic memory, etc.), capacitor, inductor, resistor, etc. It is possible that the second device DEV2 be electrically coupled to the capacitor formed (or embedded) within the substrate 210.

Figure 32C:
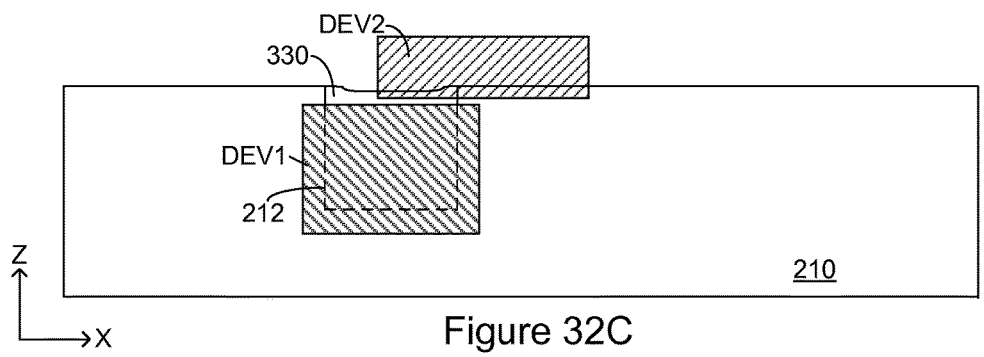
FIG. 32C shows a cross sectional view of a semiconductor structure in accordance with an embodiment of the present invention.
Figure 32D:
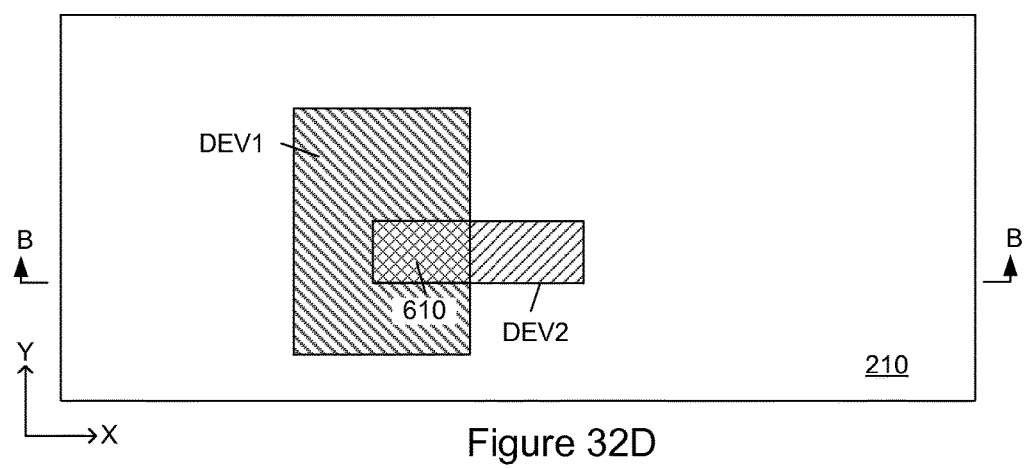
FIG. 32D shows a top view of the structure shown in FIG. 32C.

The capacitor shown, for example, in FIGS. 32A,B, may be replaced with any other type of device. This is shown in FIGS. 32C,D where the capacitor from FIGS. 32A,B has been replaced with a first device DEV1 that may be formed (or embedded) within the substrate 210. The first device DEV1 may be a capacitor or it may be any other type of device. The first device DEV1 may be an electronic device. The first device DEV1 may be a semiconductor device. The first device DEV1 may be an active device. The first device DEV1 may be a passive device. The first device DEV1 may be a memory device or a logic device. Examples of first device DEV1 include, but not limited to, transistor (MOS or bipolar), memory device (e.g., charge storage, floating gate, phase change memory, magnetic memory (for example, MRAM), capacitor, inductor, resistor, etc. In one or more embodiments, at least a portion of the first device DEV1 may be formed within the opening 212.

The second device DEV2 may be formed so that at least a portion of the second device DEV2 is formed within the layer 330 (e.g. a semiconductor layer such as a monocrystalline silicon layer). In the embodiment shown in FIGS. 32C,D, the second device DEV2 may overlie the first device DEV1 (for example, a the second device DEV2 may overlie at least a portion of the first device DEV2). In the embodiment shown, the second device DEV2 overlies the first device DEV1 and, in particular, the second device DEV2 overlies a portion 610 of the first device DEV1. In one or more embodiments, the lateral footprint of the second device DEV2 may overlap the lateral footprint of the first device DEV1.

In one or more embodiments, a second device DEV2 may be formed within and/or over the semiconductor layer 330. In one or more embodiments, at least portion of the second device DEV2 may be formed within the semiconductor layer 330. It may also be possible, in some embodiments, that the second device DEV2 may only overlie the semiconductor layer 330 and may not be formed within the semiconductor layer 330.

Referring to FIG. 32C, in one or more embodiments, the first device DEV1 (which may, for example, be a capacitor) may, for example, be substantially enclosed by semiconductor material (such as bulk monocrystalline silicon). In one or more embodiments, semiconductor material may overlie, underlie and laterally surround the device DEV1. In one or more embodiments, there may, for example, be one or more electrical contacts coupling the device DEV1 to other devices or layers.

One or more embodiments relate to a method of forming a semiconductor structure, comprising: providing a semiconductor substrate; forming an opening within the substrate; forming a conductive layer within the opening; and forming a semiconductor layer over the conductive layer. In one or more embodiments, the semiconductor layer may be formed over at least a portion of the conductive layer.

One or more embodiments relate to a method of forming a semiconductor structure, comprising: providing a semiconductor substrate; forming an opening within the substrate; forming a conductive layer within the opening; forming a semiconductor layer, the semiconductor layer at least partially closing the opening.

One or more embodiments relate to a method of forming a semiconductor structure, comprising: providing a semiconductor substrate; forming a first device within the substrate; and forming a semiconductor layer over the first device. In one or more embodiments, the semiconductor layer may be formed over at least a portion of the first device.

One or more embodiments relate to a method of forming a capacitor, comprising: forming one or more capacitor plates within a semiconductor substrate; and forming a semiconductor layer over each of the capacitor plates.

One or more embodiments relate to a semiconductor structure, comprising: a semiconductor substrate; a conductive layer disposed within the substrate; and a semiconductor layer overlying the conductive layer. In one or more embodiments, the semiconductor layer overlies at least a portion of the conductive layer. In one or more embodiments, the semiconductor layer overlies substantially all of the conductive layer.

One or more embodiments relate to a semiconductor structure, comprising: a semiconductor substrate; a first device disposed within the substrate; and a semiconductor layer overlying the first device. In one or more embodiments the semiconductor layer overlies at least a portion of the first device. In one or more embodiments, the semiconductor layer overlies substantially all of the first device.

One or more embodiments relate to a semiconductor structure, comprising: a semiconductor substrate; a device disposed within the substrate, the device substantially enclosed by at least one semiconductor material. In one or more embodiments, the device may be a capacitor.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, comprising:
   providing a semiconductor substrate;
   forming a plurality of openings within said semiconductor substrate;
   forming a plurality of conductive layers, each of said conductive layers formed within a corresponding one of said plurality of openings;
   forming a semiconductor layer over each of said plurality of conductive layers, wherein said semiconductor layer is a continuous layer formed over said plurality of conductive layers;
   electrically coupling each of said plurality of conductive layers together to form a first capacitor electrode of a capacitor by forming one or more metallization structures, the one or more metallization structures extending through a plurality of portions of the semiconductor layer to respectively contact the plurality of conductive layers, and wherein the one or more metallization structures are further formed over a side of the semiconductor layer facing away from the semiconductor substrate, the one or more metallization structures electrically coupling the plurality of conductive layers together; and
   electrically coupling said capacitor to a device, said device overlying said semiconductor substrate, at least a portion of said device disposed within said semiconductor layer, at least a portion of said device overlying at least a portion of at least one of said plurality of conductive layers.

2. The method of claim 1, wherein said forming said semiconductor layer includes an epitaxial growth process.

3. The method of claim 2, wherein said epitaxial growth process is a selective epitaxial growth process.

4. The method of claim 2, wherein said epitaxial growth spills over said conductive layers.

5. The method of claim 1, wherein said forming said semiconductor layer includes a reflow process.

6. The method of claim 5, wherein said reflow process includes a hydrogen ambient bake process.

7. The method of claim 1, wherein said semiconductor substrate is a silicon substrate.

8. The method of claim 1, wherein said semiconductor layer is a monocrystalline silicon layer.

9. The method of claim 1, wherein said at least a portion of said device is formed over substantially all of at least one of said plurality of conductive layers.

10. The method of claim 1, wherein each of said plurality of conductive layers comprises polysilicon.

11. The method of claim 1, wherein each of said plurality of conductive layers is a capacitor plate.

12. The method of claim 1, wherein said semiconductor layer is formed over substantially all of each of said plurality of conductive layers.

13. The method of claim 1, wherein said semiconductor layer includes a plurality of spaced apart semiconductor layers, each of said spaced apart semiconductor layers being formed over a corresponding one of said conductive layers.

14. The method of claim 1, wherein forming one or more metallization structures over the semiconductor layer comprises:
    forming a plurality of openings through the semiconductor layer, each of the plurality of opening exposing a portion of a respective one of the plurality of conductive layers;
    forming a plurality of conductive contacts, each of the plurality of conductive contacts formed in a respective one of the plurality of openings so that each conductive contact contacts a respective one of the conductive layers; and
    forming one or more metallization levels to electrically couple each of the conductive layers together.

15. The method of claim 14, wherein forming the plurality of conductive contacts comprises:
    forming a further conductive layer within each of the opening of the semiconductor layer and over a top surface of the semiconductor layer; and
    removing portions of the further conductive layer from the top surface of the semiconductor layer so as to form the conductive contacts.

16. The method of claim 15, wherein removing portions of the further conductive layer comprises etching the further conductive layer.

17. The method of claim 15, wherein removing portions of the further conductive layer comprises polishing the further conductive layer.

18. A method of forming a semiconductor structure, comprising:
    forming a plurality of openings within a semiconductor substrate;
    forming a plurality of conductive layers, each of said conductive layers formed within a corresponding one of said plurality of openings;
    forming a semiconductor layer over each of said plurality of conductive layers; and
    forming a first capacitor electrode of a capacitor by electrically coupling each of said plurality of conductive layers together by forming one or more metallization levels formed over a side of the semiconductor layer facing away from the semiconductor substrate,
    wherein said plurality of conductive layers are permanently electrically coupled together by metallization structures formed over the semiconductor substrate.

19. The method of claim 18, wherein said forming said semiconductor layer includes an epitaxial growth process.

20. The method of claim 19, wherein said epitaxial growth process is a selective epitaxial growth process.

21. The method of claim 19, wherein said epitaxial growth spills over said plurality of conductive layers.

22. The method of claim 18, wherein said forming said semiconductor layer includes a reflow process.

23. The method of claim 22, wherein said reflow process includes a hydrogen ambient bake process.

24. The method of claim 18, wherein said semiconductor substrate is a silicon substrate.

25. The method of claim 18, wherein said semiconductor layer is a monocrystalline silicon layer.

26. The method of claim 18, wherein each of said plurality of conductive layers comprises polysilicon.

27. The method of claim 18, wherein each of said plurality of conductive layers is a capacitor plate.

28. The method of claim 18, wherein said semiconductor layer is formed over substantially all of each of said plurality of conductive layers.

29. The method of claim 18, wherein said semiconductor layer includes a plurality of spaced apart semiconductor layers, each of said spaced apart semiconductor layers formed over a corresponding one of said conductive layer.

30. The method of claim 18, wherein said semiconductor layer is a continuous layer formed over said plurality of conductive layers.

* * * * *